(12) United States Patent
Hayashi et al.

(10) Patent No.: US 9,449,732 B2
(45) Date of Patent: Sep. 20, 2016

(54) CHARGE TRANSPORT FILM, METHOD FOR PRODUCING THE SAME, AND LIGHT-EMITTING ELEMENT AND PHOTOELECTRIC CONVERSION ELEMENT USING THE SAME

(75) Inventors: Naoyuki Hayashi, Kanagawa (JP); Yoshio Inagaki, Kanagawa (JP); Tasuku Satou, Kanagawa (JP); Kana Morohashi, Kanagawa (JP); Koji Takaku, Kanagawa (JP); Ryo Nishio, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1089 days.

(21) Appl. No.: 13/513,132

(22) PCT Filed: Nov. 29, 2010

(86) PCT No.: PCT/JP2010/071771
§ 371 (c)(1),
(2), (4) Date: May 31, 2012

(87) PCT Pub. No.: WO2011/068232
PCT Pub. Date: Jun. 9, 2011

(65) Prior Publication Data
US 2012/0238774 A1 Sep. 20, 2012

(30) Foreign Application Priority Data
Dec. 3, 2009 (JP) .................. 2009-275886

(51) Int. Cl.
*H01B 1/00* (2006.01)
*H01L 51/00* (2006.01)
(Continued)

(52) U.S. Cl.
CPC ........... *H01B 1/121* (2013.01); *H01L 51/0003* (2013.01); *H01L 51/004* (2013.01);
(Continued)

(58) Field of Classification Search
CPC .............. H01B 1/121; H01L 51/0026; H01L 51/0029; H01L 51/0051; H01L 51/5048; H01L 51/56; B05D 3/007; B05D 5/12
See application file for complete search history.

(56) References Cited

U.S. PATENT DOCUMENTS

2002/0113248 A1* 8/2002 Yamagata et al. ............ 257/187
2004/0150331 A1   8/2004 Okubo et al.
(Continued)

FOREIGN PATENT DOCUMENTS

CN  101097990 A  1/2008
JP  7-114987 A   5/1995
(Continued)

OTHER PUBLICATIONS

Tendero et al "Atmospheric pressure plasmas: A review", Spectrochimica Acta Part B 61 (2006) 2-30.*
(Continued)

*Primary Examiner* — Mark Kopec
(74) *Attorney, Agent, or Firm* — Sughrue Mion, PLLC

(57) ABSTRACT

The present invention provides a charge transport film which is prepared through subjecting a coating film including at least one charge transporting agent to an atmospheric pressure plasma treatment, wherein electron transfer between the charge transport film and a substance that contacts with the charge transport film is promoted, and deterioration in performance due to diffusion and mixing or crystallization of low molecular weight components, such as a charge transporting agent, incorporated in a cured film is suppressed also in the case of film formation by a wet method, and which exhibits excellent charge transportability and stability over time; a production method with good productivity; and a light-emitting element and photoelectric conversion element equipped with the charge transport film, the atmospheric pressure plasma treatment being preferably a treatment that applies plasma, which is generated using a plasma generating apparatus and conveyed using an inert gas, to the coating film.

10 Claims, 3 Drawing Sheets

(51) Int. Cl.
  *B05D 5/00* (2006.01)
  *H01B 1/12* (2006.01)
  *H05B 33/22* (2006.01)
  *H01L 51/50* (2006.01)

(52) U.S. Cl.
  CPC ....... *H01L51/0026* (2013.01); *H01L 51/0035* (2013.01); *H01L 51/0037* (2013.01); *H05B 33/22* (2013.01); *H01L 51/0076* (2013.01); *H01L 51/0085* (2013.01); *H01L 51/5048* (2013.01); *H01L 51/5088* (2013.01); *Y02E 10/549* (2013.01); *Y02P 70/521* (2015.11)

(56) References Cited

U.S. PATENT DOCUMENTS

| | | | |
|---|---|---|---|
| 2004/0201048 | A1 | 10/2004 | Seki et al. |
| 2004/0211956 | A1 | 10/2004 | Kanno et al. |
| 2005/0027028 | A1 | 2/2005 | Kelly et al. |
| 2005/0170076 | A1 | 8/2005 | Seki et al. |
| 2005/0170550 | A1 | 8/2005 | Seki et al. |
| 2005/0186106 | A1 | 8/2005 | Li et al. |
| 2005/0186403 | A1 | 8/2005 | Seki et al. |
| 2006/0081566 | A1 | 4/2006 | DeVries et al. |
| 2006/0182899 | A1 | 8/2006 | Kelly et al. |
| 2007/0202612 | A1 | 8/2007 | Winter-Jensen et al. |
| 2007/0210721 | A1 | 9/2007 | Aldea et al. |
| 2008/0074037 | A1 | 3/2008 | Fukase et al. |
| 2008/0113204 | A1 | 5/2008 | Okubo et al. |
| 2008/0271748 | A1 | 11/2008 | De Vries et al. |
| 2009/0020751 | A1 | 1/2009 | Seki et al. |
| 2009/0148615 | A1 | 6/2009 | Vangeneugden et al. |
| 2010/0090590 | A1 | 4/2010 | Ogata et al. |
| 2010/0255625 | A1 | 10/2010 | Vries |

FOREIGN PATENT DOCUMENTS

| | | |
|---|---|---|
| JP | 7-235379 A | 9/1995 |
| JP | 2000-048962 A | 2/2000 |
| JP | 2000347432 A | 12/2000 |
| JP | 2001316976 A | 11/2001 |
| JP | 2002-255934 A | 9/2002 |
| JP | 2002-334782 A | 11/2002 |
| JP | 2004-119303 A | 4/2004 |
| JP | 2004252422 A | 9/2004 |
| JP | 2004311385 A | 11/2004 |
| JP | 2005-243432 A | 9/2005 |
| JP | 2005243300 A | 9/2005 |
| JP | 2006080060 A | 3/2006 |
| JP | 2006-222195 A | 8/2006 |
| JP | 2007501134 A | 1/2007 |
| JP | 2007253589 A | 10/2007 |
| JP | 2007-302886 A | 11/2007 |
| JP | 2008010251 A | 1/2008 |
| JP | 2008-060115 A | 3/2008 |
| JP | 2008227483 A | 9/2008 |
| JP | 2008234857 A | 10/2008 |
| KR | 10-2008-0001626 A | 1/2008 |
| WO | 2007105428 A1 | 9/2007 |
| WO | 2009/031886 A2 | 3/2009 |

OTHER PUBLICATIONS

Notification of the First Office Action, dated Jun. 19, 2014, issued in corresponding CN Application No. 201080054548.4, 11 pages in English and Chinese.
Lan, "Functional Polymer Material," pp. 114-115, Northwestern Polytechnical University Press, published Jun. 1995, three pages in Chinese with relevance of material discussed on p. 6 of the English translation of the Notification of the First Office Action dated Jun. 19, 2014, attached herewith.
Office Action, dated Nov. 24, 2014, issued in corresponding TW Application Doc No. 10321637580, 7 pages in English and Chinese.
Y. Goto, et al., "All-Wet-Process Organic Electroluminescent Device Using Electron Transporting and Alcohol-Soluble Organic Semiconductor", IDW '04 Proceedings of the 11$^{th}$ International Display Workshop, Dec. 8-10, 2004, pp. 1343-1346.
Daisuke Kumaki, et al., "Evaluation of Carrier Transport Property and EL Performance of Photocurable Hole-transport Material", Forum on Organic EL Displays, Proceedings of the 1$^{st}$ Regular Meeting, Nov. 18, 2005, S4-5, p. 27.
He Yan, et al., "High-Performance Hole-Transport Layers for Polymer Light-Emitting Diodes. Implementation of Organosiloxane Cross-Linking Chemistry in Polymeric Electroluminescent Devices", J. Am. Chem. Soc., Feb. 8, 2005, pp. 3172-4183, vol. 127, No. 9.
Yoshihito Osada, et al., "Plasma-Initiated Solid-State Polymerization of Trioxane and Tetraoxane", Journal of Polymer Science: Polymer Letters Edition, 1978, pp. 669-675, vol. 16.
Communication, dated Mar. 28, 2014, issued in corresponding EP Application No. 10834680.0, 9 pages in English.
Notice of Reasons for Rejection, mailed Sep. 24, 2014, issued in corresponding JP Application No. 2010-254140, 6 pages in English and Japanese.
Notice of Reasons for Rejection, dated Feb. 4, 2014, issued in corresponding JP Application No. 2010-254140, 7 pages in English and Japanese.
Kanazawa, S. et al, "Carbon Film Formation and Surface Modification by Cold Plasma at Atmospheric Pressure", Proceedings of Japan Symposium on Plasma Chemistry (1987), Proceedings of Japan Symposium on Plasma Chemistry, ISPC-8 Tokyo, pp. 1839-1844, vol. 3.
Notification of Request for Submission of Argument, dated Jan. 30, 2015, issued in corresponding Korean Application No. 10-2012-7017225, 8 pages in English and Korean.
Office Action dated Aug. 31, 2015 from the Korean Intellectual Property Office in counterpart Korean Application No. 10-2012-7017225.
Office Action dated Apr. 22, 2016 from the European Patent Office issued in corresponding European Application No. 10834680.0.
Office Action issued on Apr. 1, 2016 from the Korean Intellectual Property Office in counterpart Korean Application No. 10-2012-7017225.

* cited by examiner

CHARGE TRANSPORT FILM, METHOD FOR PRODUCING THE SAME, AND LIGHT-EMITTING ELEMENT AND PHOTOELECTRIC CONVERSION ELEMENT USING THE SAME

BACKGROUND OF THE INVENTION

1. Technical Field

The present invention relates to an organic semiconductor thin film, a charge transport film, a method for producing the charge transport film, and a light-emitting element and photoelectric conversion element that use the charge transport film. In particular, the invention relates to a charge transport film which is useful for forming an organic photoelectronics element having plural functional thin films (layers), a method for producing the same, and a light-emitting element and photoelectric conversion element that are equipped with such a charge transport film.

2. Background Art

Organic electronics elements are elements which perform electric action by using organic substances, and have been expected to demonstrate strong points such as energy saving, low costs, and flexibility. Organic electronic elements have attracted attention as technologies replacing conventional inorganic semiconductors which mainly use silicone. In recent years, since lamination layer type organic electroluminescence elements prepared by using a vacuum deposition method have been on the market, studies for development of organic EL (electroluminescence) displays have become more popular, and now, organic EL displays are being put to practical use.

In such lamination layer type organic electroluminescence elements, plural organic layers (for example, a light-emitting layer, a hole injection layer, a hole transport layer, an electron transport layer, and the like) are integrated and disposed between an anode and a cathode. Formation of these organic layers is usually carried out through vacuum deposition of organic compounds having a relatively low molecular weight. However, vacuum deposition methods have a lot of problems with respect to production suitability such that large-scale facilities are needed, uniform thin films without defects are difficult to obtain, a long time is needed for forming plural organic layers in accordance with a deposition method, or the like. Similar problems exist, not only in the case of light-emitting elements, but also in the case of organic thin-film solar batteries containing plural organic charge transport films.

Therefore, technologies that construct the organic layers, not by a vapor phase method, but by a wet method such as coating or printing, are required from the viewpoint of improvement in productivity. However, in the case of providing plural layers in a laminated form by a wet method, mutual dissolution between the layers should be suppressed, and diffusion of effective components to adjacent layers at the interface of the layers should be suppressed. In order to solve the above problems, various means have been studied. For example, use of organic layers which form a crosslink structure by applying heat or radiation (see, for example, Japanese Patent Application Laid-Open (JP-A) No. 7-114987; Daisuke Kumaki, Kengo Hirose, Nobuaki Koike, Akira Kuriyama, and Shizuo Tokitou, Proceedings of The First Regular Meeting of the Organic EL Panel Discussion, page 27 (2005); and H. Yan, P. Lee, N. R. Armstrong, A. Graham, G. A. Evmenenko, P. Dutta, and T. J. Marks, J. Am. Chem. Soc., vol. 127, pages 3172 to 4183 (2005)), and formation of a three-layer structure in which compounds having a large difference in solubility from each other are used in combination (see, for example, Y. Goto, T. Hayashida, and M. Noto, IDW'04 Proceedings of The 11th International Display Workshop, pages 1343 to 1346 (2004)) are known. However, all of the above means have problems in that element performance is insufficient, as well as in that usable raw materials are limited, stability of the raw material itself is insufficient, or the like. In order to solve these problems, use of an epoxy-based or oxetane-based crosslinkable polymer has been proposed (see, for example, JP-A No. 2007-302886).

Also in a case in which an organic cured layer utilizing a crosslink structure is prepared, these are problems in that organic low molecular weight components may diffuse in the cured layer, which may cause crystallization, and element performance may be deteriorated. Alternatively, even if crystallization is not caused, organic molecules which have been aligned, at first, in a molecular configuration suitable to charge transport may diffuse and move, whereby charge transporting capacity may be deteriorated.

Specifically, for example, organic electroluminescence elements (hereinafter, also properly referred to as organic EL elements) equipped with a hole transport layer including a hole transport material having a high hole transporting capacity, such as aromatic tertiary amines typified by N,N'-diphenyl-N,N'-bis(3-methylphenyl)-1,1'-biphenyl-4,4'-diamine (hereinafter, referred to as "TPD"), exhibit excellent initial light emission brightness and excellent initial light emission efficiency. However, the above organic EL elements have problems in that, after a very short time from the beginning of use, light emission efficiency is deteriorated and light emission brightness is deteriorated. One of the reasons for this phenomenon is thought to be as follows. Namely, since all of the above hole transport materials are low molecular weight materials, the melting point, glass transition temperature, crystallization temperature, and the like of the hole transport materials are low (for example, the glass transition temperature (Tg) of TPD is 63° C.), and thermal characteristics thereof are insufficient, and as a result, the hole transport material itself may be deteriorated due to the Joule heat which is generated when electric current flows to the element, or formation of exciplex between the hole transport material and a light-emitting material may easily occur.

Moreover, in organic EL elements, for the purpose of raising the carrier injection efficiency, the interface between organic layers and the interface between an organic layer and an electrode layer are finished to be as smooth as possible, and each of the above organic layers is made amorphous. However, it is thought that, when a hole transport material having a low molecular weight is used, since the crystallization temperature thereof is low, molecular aggregation occurs easily, whereby the carrier injection efficiency may be deteriorated or the light emission efficiency of the element may be deteriorated.

Therefore, it is preferable to fix the molecular configuration in order to prevent aging-induced changes in performance of the charge transport film, during preparation, during storage, or during driving of the organic electronics element using the charge transport film.

For fixing the molecular configuration, a usual method is to prevent the transfer of molecules by constructing a network structure of a polymer through adding a polymerizable monomer or a polymer having a crosslinkable group, and a photopolymerization initiator, and then performing photoirradiation to allow polymerization and crosslinking. However, with regard to the charge transport film in which high purity is required for the raw materials to be used, the existence of an initiator or its decomposition products is not preferable. The reason for this is as follows. Namely, when an initiator or its decomposition products exist, these may act as charge traps to remarkably deteriorate the charge transporting capacity and stability thereof over time. Therefore, in the case of using an initiator in an electroluminescence element, the initiator may cause lowering of brightness or deterioration in durability. Further, in the case of using an initiator in a photoelectric conversion element, the initiator may cause lowering of conversion efficiency or deterioration in durability. Accordingly, a method for performing polymerization fixation without using an initiator has been required.

As a polymerization method that does not use an initiator, plasma-initiated polymerization is known (see, for example, Y. Osada, M. Shen, and A. T. Bell, J. Polymer Sci., Polymer Letters Ed., vol. 16, pages 669 to 675 (1978)). However, since plasma irradiation is performed in vacuo or at a high temperature, batch processing is mainly performed, and since large-scale facilities are needed, it is not practical from the viewpoint of productivity. Moreover, since materials are exposed to a high temperature or electric discharge, there is a problem in that decomposition and deterioration of the surface of organic materials cannot be avoided. In 1987, it became possible to generate plasma at a relatively low temperature and under atmospheric pressure by performing intermittent discharge in a rare gas (see, for example, S. Kanazawa, M. Kogoma, T. Moriwaki, and S. Okazaki, Proceedings of Japan Symposium on Plasma Chemistry, vol. 3, page 1839 (1987)), and a technique of applying the atmospheric pressure plasma to a surface treatment of a base has been disclosed (see, for example, JP-A No. 2008-60115). However, even under a low temperature and atmospheric pressure, it was a concern that the influence upon the coating film at the time of direct irradiation of an organic layer with plasma was significant, and there have been no application of the technique to a coating film containing an electron transporting agent or a compound exhibiting liquid crystallinity was practically problematic.

SUMMARY OF THE INVENTION

According to an aspect of the invention, a charge transport film which is prepared through subjecting a coating film including at least one charge transporting agent to an atmospheric pressure plasma treatment, wherein electron transfer between the charge transport film and a substance that contacts with the charge transport film is promoted, and deterioration in performance due to diffusion and mixing or crystallization of low molecular weight components, such as a charge transporting agent, incorporated in a cured film is suppressed also in the case of film formation by a wet method, and which exhibits excellent charge transportability and stability over time; a production method with good productivity; and a light-emitting element and photoelectric conversion element equipped with the charge transport film, are provided.

Technical Problem

An object of the preset invention considering the above problems is to provide a charge transport film, in which deterioration in performance caused by diffusion and mixing or crystallization of low molecular weight components, such as a charge transporting agent, incorporated in the cured film or the like is suppressed also in the case of performing layer formation by a wet method, and which exhibits excellent charge transportability and excellent stability over time, as well as to provide a light-emitting element and photoelectric conversion element that are equipped with the charge transport film.

Further, another object of the present invention is to provide a method for producing a charge transport film, the method enabling production of a charge transport film in high productivity without requiring exceptionally large-scale facilities, wherein the charge transport film is formed through promptly curing in the absence of a compound such as a polymerization initiator that exerts influence upon charge transportability, and exhibits excellent charge transportability and excellent stability over time.

Solution to Problem

As a result of the earnest investigation made of the present inventors in view of the above problems, it has been found that the objects of the invention can be achieved by the following means. Exemplary embodiments of the present invention include the followings.

<1> A charge transport film formed through subjecting a coating film including at least one charge transporting agent to an atmospheric pressure plasma treatment, wherein electron transfer between the charge transport film and a substance that contacts with the charge transport film is promoted. The above charge transport film promptly cures in the absence of a polymerization initiator as an impurity and under an oxygen atmosphere, to provide a charge transport film having excellent durability.

According to the above aspect, a charge transport film, in which deterioration in performance caused by diffusion and mixing or crystallization of low molecular weight components incorporated in the cured film formed or the like is suppressed, and which exhibits excellent charge transportability and excellent durability, may be formed even in the case of forming a large-area film by a wet method.

<2> The charge transport film according to the item <1>, wherein the coating film further includes a compound having a crosslinkable group or a polymerizable group.

According to the above aspect, a stable charge transport film having excellent curability may be formed and, even in the case of providing plural layers in a laminated form by a wet method, transfer of low molecular weight components to adjacent layers, which is caused by mutual dissolution at the interface, can be suppressed.

<3> The charge transport film according to the item <2>, wherein the compound having a crosslinkable group or a polymerizable group is at least one selected from the group consisting of a polymer having a crosslinkable group, an oligomer having a crosslinkable group and a monomer having a crosslinkable group.

<4> The charge transport film according to any one of the items <1> to <3>, wherein the charge transporting agent is a compound having a polymerizable group.

<5> The charge transport film according to any one of the items <1> to <4>, wherein the charge transporting agent incorporated in the coating film is a charge transporting agent precursor that becomes a charge transporting agent by plasma treatment.

<6> The charge transport film according to any one of the items <1> to <5>, further including a compound exhibiting liquid crystallinity.

<7> The charge transport film according to any one of the items <1> to <6>, wherein the charge transporting agent includes a compound exhibiting liquid crystallinity.

The charge transport film may maintain liquid crystallinity even when the film includes a compound exhibiting liquid crystallinity or a liquid crystal phase, since forming the film is preformed without exposing to a high temperature.

<8> The charge transport film according to any one of the items <1> to <7>, wherein the coating film includes a compound represented by following Formula (I):

A-G,    Formula (I):

wherein, in Formula (I), A represents a residue of a compound that can exist in a liquid crystalline state; and G represents a polymerizable group selected from the group consisting of radically polymerizable groups and cationically polymerizable groups, or a crosslinkable group.

<9> The charge transport film according to any one of the items <1> to <8>, wherein the coating film includes a compound represented by following Formula (II):

T-G,    Formula (II):

wherein, in Formula (II), T represent a residue of a triphenylamine compound; and G represents a polymerizable group selected from the group consisting of radically polymerizable groups and cationically polymerizable groups, or a crosslinkable group.

<10> A method for producing a charge transport film, the method including: forming a coating film including at least one charge transporting agent, and applying, to the formed coating film, plasma generated using an atmospheric pressure plasma generating apparatus, in an inert gas flow.

According to this method, a charge transport film, which has a high crosslinking density and in which diffusion or crystallization of the charge transporting agent incorporated therein or the like is effectively suppressed, can be formed even under atmospheric air condition.

<11> A method for producing a charge transport film, the method including: forming a coating film including at least one charge transporting agent, and applying, to the formed coating film, an inert gas plasma generated using an atmospheric pressure plasma generating apparatus in which electricity is conducted via a pulse control element.

<12> The method for producing a charge transport film according to the item <10> or the item <11>, wherein the application of plasma is performed at ordinary temperature.

<13> The method for producing a charge transport film according to any one of the items <10> to <12>, wherein the coating film includes a compound exhibiting liquid crystallinity.

<14> A light emitting element comprising the charge transport film according to any one of the items <1> to <9>.

<15> A photoelectric conversion element including the charge transport film according to any one of the items <1> to <9>.

<16> A compound represented by following Formula (III):

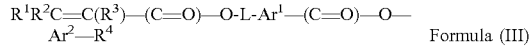
Formula (III)

wherein, in Formula (III), $Ar^1$ and $Ar^2$ each independently represent an arylene group; L represents a divalent linking group selected from the group consisting of alkylene groups having from 1 to 22 carbon atoms, arylene groups having from 6 to 22 carbon atoms, and —O—, or a divalent linking group obtained by combining two or more linking groups selected from the group consisting of alkylene groups having from 1 to 22 carbon atoms, arylene groups having from 6 to 22 carbon atoms, and —O—; and $R^1$, $R^2$, $R^3$ and $R^4$ each independently represent a hydrogen atom or an alkyl group having 1 to 8 carbon atoms.

The compound represented by Formula (III) is a novel charge transport compound exhibiting liquid crystallinity, and is preferably applicable to a charge transport film and a method for producing a charge transport film of the exemplary embodiment of the invention.

Advantageous Effects of Invention

According to the present invention, a charge transport film, in which the charge transport film is formed by promptly curing in the absence of a compound such as a polymerization initiator that exerts influence upon charge transportability, and simultaneously, deterioration in performance caused by diffusion and mixing or crystallization of low molecular weight components incorporated in the cured film formed or the like is suppressed, also in the case of performing film formation by a wet method, and which exhibits excellent charge transportability and excellent durability; and a light-emitting element and photoelectric conversion element that are equipped with the charge transport film can be provided.

Further, according to the present invention, a method for producing a charge transport film, the method enabling production of the charge transport film of the present invention in high productivity and without requiring exceptionally large-scale facilities, can be provided.

BRIEF DESCRIPTION OF DRAWINGS

Exemplary embodiments of the invention will be described in detail based on the following figures, wherein.

DESCRIPTION OF EMBODIMENTS

Figure 1:
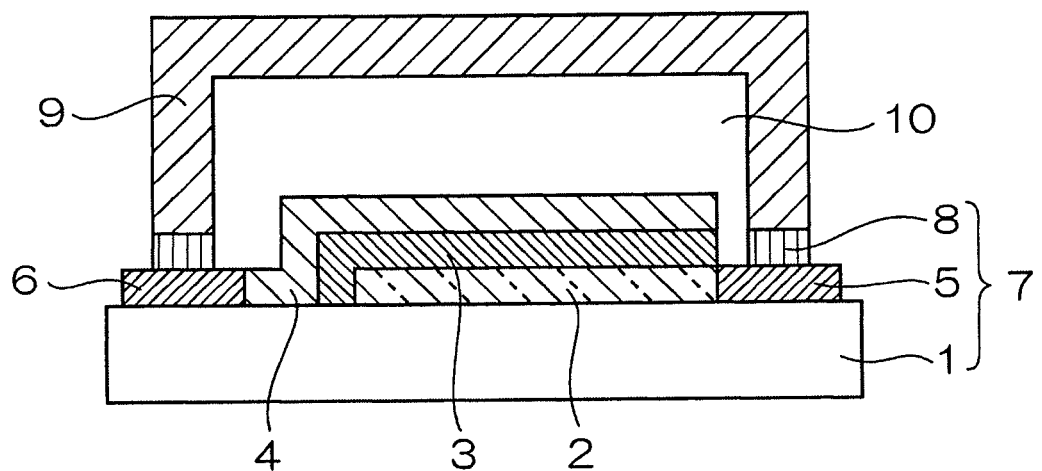
FIG. 1 is a schematic cross-sectional diagram showing one exemplary embodiment of an organic electroluminescence element according to the present invention.

Hereinafter, the present invention is explained in detail.

<Charge Transport Film and Production Method Thereof>

The charge transport film of the present invention is characterized in that it is prepared through subjecting a coating film, which contains a charge transporting agent and is formed by a wet method, to an atmospheric pressure plasma treatment.

The charge transport film of the invention has excellent surface smoothness, and does not contain impurities that exert influence on charge transportability, and further, has high crosslinking density, and excellent film properties. Therefore, aging-induced deterioration in charge transportability caused by diffusion or aggregation of a low molecular weight charge transporting agent or the like is prevented, and thus, the charge transport film has excellent durability.

Therefore, as a result, in the charge transport film, electron transfer between the charge transport film and a substance that is in contact with the charge transport film is promoted.

Details on such charge transport film are explained with a production method thereof which is excellent in productivity.

It is preferable that the charge transport film of the present invention is preferably formed by a production method including: forming a coating film containing at least one charge transporting agent (a coating film formation step); and applying plasma generated using an atmospheric pressure plasma generating apparatus to the coating film formed through conveying the plasma by an inert gas (a plasma treatment step).

The charge transport film obtained by the preferable method, which is described below in detail, is characterized in that the content ratio of the constituent components of the film at a surface of the film in which plasma treatment has been applied and that at the opposite surface thereof are different. Therefore, the two surfaces differ in terms of softening initiation temperature accompanying elevation of the temperature of each film surface, surface smoothness, and contact angle with respect to the solvent of a solution to be coated onto the film.

With regard to the nature of the surface which has been subjected to plasma treatment, compared with a surface of a general charge transport film obtained by performing crosslinking and curing processing using a photopolymerization initiator or a thermal polymerization initiator, the average molecular weight is greater, the softening initiation temperature accompanying temperature elevation is higher by 10° C. or more, surface smoothness is lower by 10% or more in terms of Ra value, and the contact angle with respect to the solvent of a solution to be coated onto the film is smaller by 2 degrees or more.

The content of impurities, other than the monomers in the film, polymers thereof, and substances which had been intentionally added, is 5% or less, preferably 1% or less, and particularly preferably 0.1% or less. As described above, it is thought that, in the charge transport film of the invention, which does not contain impurities derived from components such as an initiator and the like, electron transfer may be promoted by extremely suppressing the influence of impurities.

[1. Coating Film Formation Step]

In order to form the charge transport film of the present invention, first, a coating film containing a charge transporting agent is formed on a surface of an arbitrary substrate (support).

The coating film contains at least a charge transporting agent. From the viewpoint of curability, it is preferable that the coating film further contains a compound having a crosslinkable group or a polymerizable group (hereinafter, may be properly referred to as a crosslinkable compound). It should be noted that, in a case in which the charge transporting agent has a crosslinkable group or a polymerizable group in a molecule thereof, the crosslinkable compound is not always necessary.

(Charge Transporting Agent)

There is no particular limitation on the charge transporting agent incorporated in the coating film for forming the charge transport film, and a known charge transporting agent may be appropriately selected from among compounds having a function of transporting charges, for example, hole transport materials, electron transport materials, and the like, and used. Further, as long as the cured film formed has charge transportability, the charge transporting agent incorporated in the coating film may be a charge transporting agent precursor that becomes a charge transporting agent by plasma treatment. In this specification, the "charge transporting agent" incorporated in the coating film includes such "charge transporting agent precursor". One kind of the charge transporting agents may be incorporated in the coating film, or two or more kinds of them may be incorporated in the coating film. Namely, in a case in which two or more kinds of the charge transporting agents are incorporated in the coating film, these may be two or more of charge transporting agents, may be two or more of charge transporting agent precursors, or may be two or more of compounds which form a combination of (a) charge transporting agent(s) and (a) charge transporting agent precursor(s).

A coating liquid used for forming a coating film in accordance with a wet film-forming method (coating process), such as that in the present invention, usually includes a material for forming an organic layer and a solvent for dissolving or dispersing the material.

The solvent is not particularly limited, and may be selected according to the material used for forming the organic layer. Specific examples of the solvent include halogen-containing solvents (chloroform, carbon tetrachloride, dichloromethane, 1,2-dichloroethane, chlorobenzene, and the like), ketone solvents (acetone, methyl ethyl ketone, diethyl ketone, n-propyl methyl ketone, cyclohexanone, and the like), aromatic solvents (benzene, toluene, xylene, and the like), ester solvents (ethyl acetate, n-propyl acetate, n-butyl acetate, methyl propionate, ethyl propionate, γ-butyrolactone, diethyl carbonate, and the like), ether solvents (tetrahydrofuran, dioxane, methyl t-butyl ether, and the like), amide solvents (dimethyl formamide, dimethyl acetamide, and the like), alcohol solvents (ethanol, 2-methoxyethanol, propylene glycol, benzyl alcohol, and the like), dimethyl sulfoxide, and water. The amount of solid matter with respect to the solvent in the coating liquid is not particularly limited, and the viscosity of the coating liquid may arbitrarily be selected depending on the desired film thickness, the coating means, or the like.

The hole transport material is not particularly limited as long as the material has any of: the function of injecting holes from the anode, the function of transporting the holes, and the function of blocking the electrons injected from the cathode. The hole transport material may be a low-molecular weight material or a high-molecular weight material. Specific examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, polysilane compounds, poly (N-vinylcarbazole) derivatives, aniline copolymers, thiophene oligomers, conductive polymers such as polythiophene (for example, polyethylenedioxythiophene/polystyrenesulfonic acid, polyethylenedioxythiophene/Nafion (trade name, manufactured by Du Pont Kabushiki Kaisha), and the like), polythiophene derivatives, polyphenylene derivatives, polyphenylene vinylene derivatives, polyfluorene derivatives, and ploytriarylamine derivatives.

Among above, conductive polymers such as arylamine derivatives and polythiophene are preferable as the hole transport material. Specific examples thereof include materials described in, for example, JP-A Nos. 11-292829, 2000-150169, 2002-25780, 2003-82035, 2004-303636, 2004-18787, 2004-199935, 2008-186872, and 2008-311367. Specific examples of usable hole transport materials in exemplary embodiments of the invention are shown in followings.

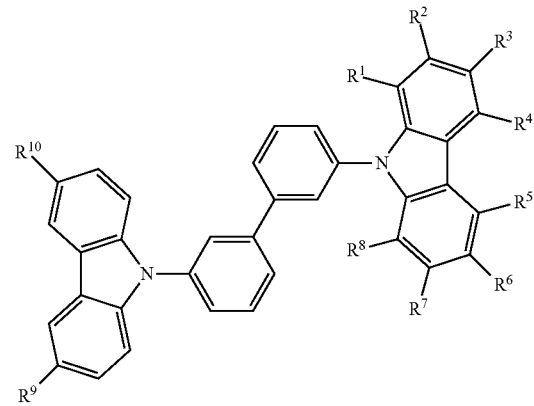

| Sample No. | $R^1$ | $R^2$ | $R^3$ | $R^4$ | $R^5$ | $R^6$ | $R^7$ | $R^8$ | $R^9$ | $R^{10}$ |
|---|---|---|---|---|---|---|---|---|---|---|
| H-1  | H  | H  | H    | H  | H | H    | H | H | H    | H    |
| H-2  | H  | Me | H    | H  | H | H    | H | H | H    | H    |
| H-3  | H  | H  | t-Bu | H  | H | H    | H | H | H    | H    |
| H-4  | Cl | H  | H    | H  | H | H    | H | H | H    | H    |
| H-5  | H  | H  | t-Bu | H  | H | t-Bu | H | H | t-Bu | t-Bu |
| H-6  | H  | H  | t-Bu | H  | H | t-Bu | H | H | t-Bu | H    |
| H-7  | H  | H  | t-Bu | H  | H | H    | H | H | t-Bu | H    |
| H-8  | H  | H  | t-Bu | H  | H | t-Bu | H | H | H    | H    |
| H-9  | H  | H  | H    | Me | H | H    | H | H | H    | H    |
| H-10 | H  | Me | Me   | H  | H | H    | H | H | H    | H    |
| H-11 | H  | H  | OMe  | H  | H | H    | H | H | H    | H    |
| H-12 | H  | H  | Ph   | H  | H | H    | H | H | H    | H    |

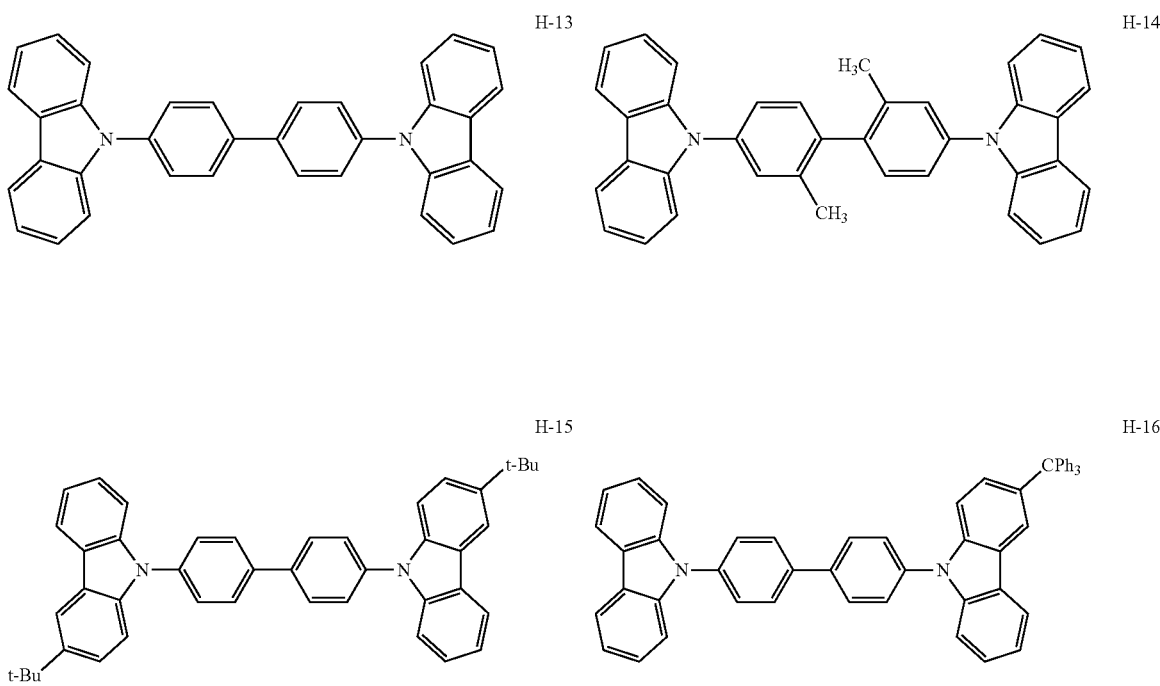

-continued
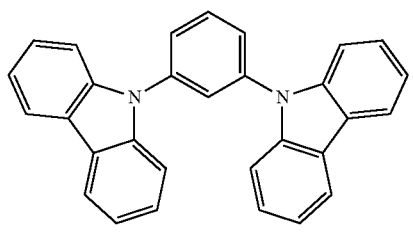
H-17
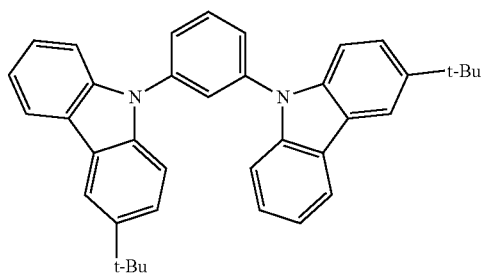
H-18
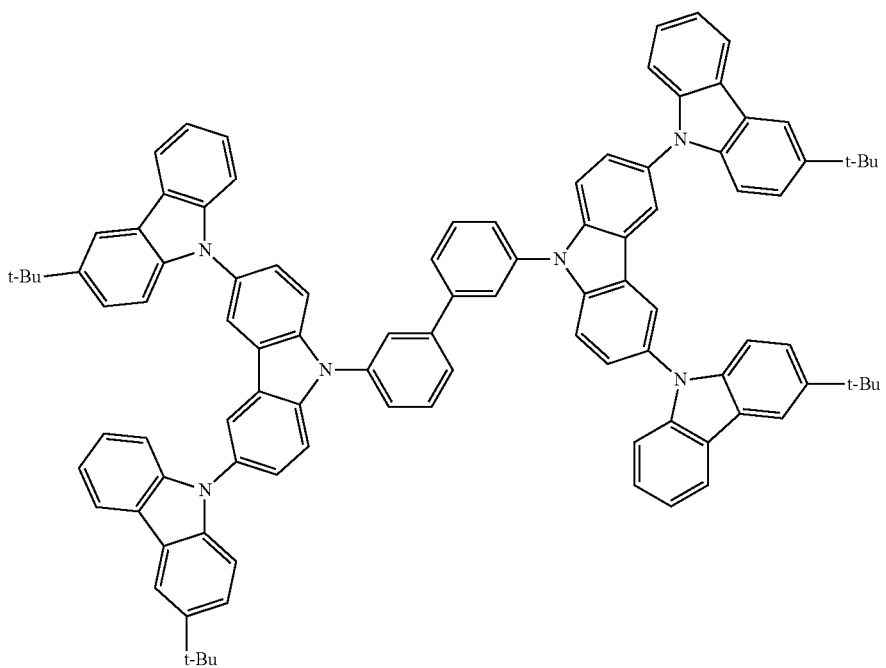
H-19
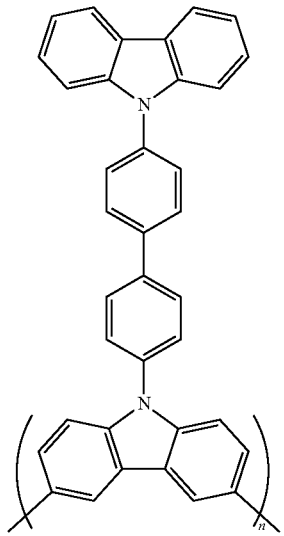
H-20
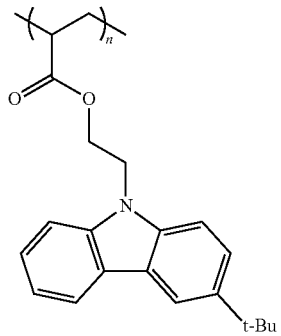
H-21

-continued

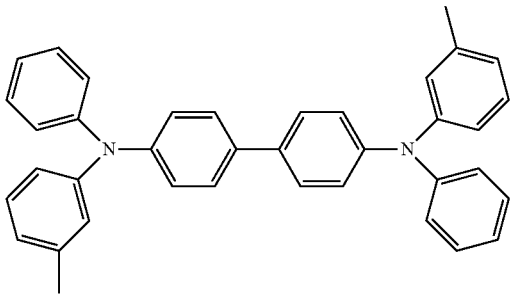
H-22

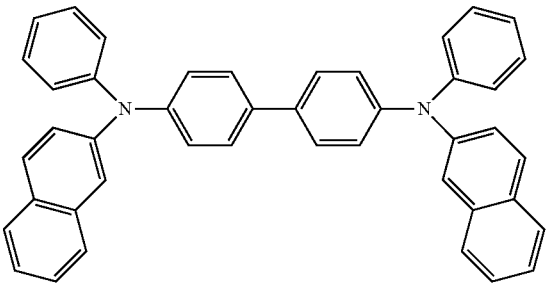
H-23

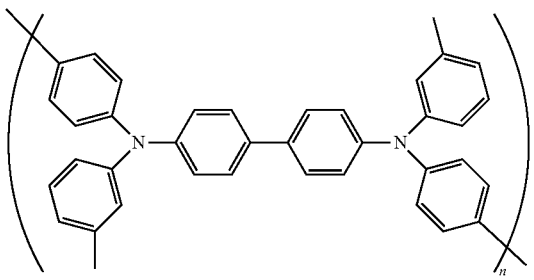
H-24

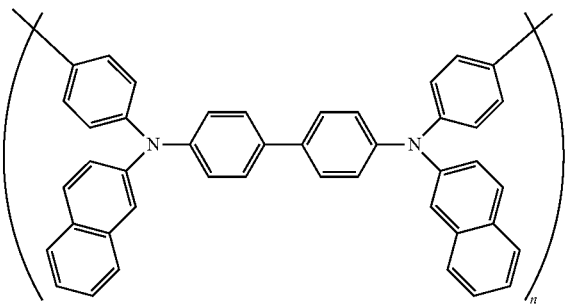
H-25

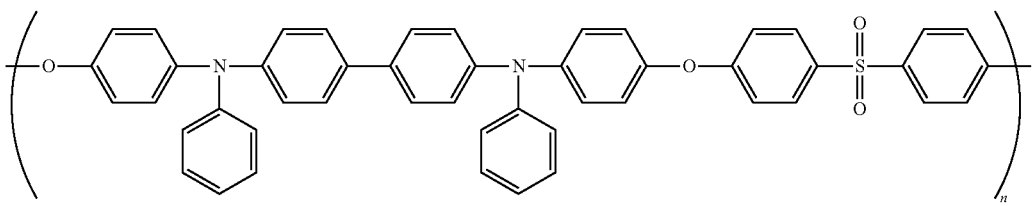
H-26

The electron transport material is not particularly limited as long as the material has any of: the function of injecting electrons from the cathode, the functions of transporting the electrons, and the function of blocking holes injected from the anode. Specific examples thereof include triazole derivatives, oxazole derivatives, oxadiazole derivatives, fluorenone derivatives, anthraquinodimethane derivatives, anthrone derivatives, diphenylquinone derivatives, thiopyranedioxide derivatives, carbodiimide derivatives, fluorenylidene methane derivatives, distyrylpyrazine derivatives, aromatic tetracarboxylic anhydrides such as naphthalene tetracarboxylic anhydride and perylene tetracarboxylic anhydride, heterocyclic tetracarboxylic anhydrides, phthalocyanine derivatives, metal complexes of 8-quinolinol derivatives, metal phthalocyanine, metal complexes having benzoxazole, benzothiazole, or the like as a ligand, conductive polymers such as aniline copolymers, thiophene oligomers, and polythiophene, polythiophene derivatives, polyphenylene derivatives, polyphenylene vinylene derivatives, polyfluorene derivatives, pyrimidine derivatives, pyridine derivatives and carbazole derivatives.

Specific examples of the electron transport material include materials described in, for example, JP-A Nos. 11-140060, 11-95265, 9-316441, 2002-10167, 2003-297391, 2007-258692, 2007-266593 and International Patent Application Publication No. WO2007/080801.

Further, as shown below, by using a compound formed by introducing a crosslinkable group or a polymerizable group into the above charge transporting agent, for example, a compound represented by the following Formula (II) or the like, the charge transporting agent itself contributes to curability. Moreover, in a case in which a charge transport film (layer) is formed using the above compound as a charge transporting agent, the charge transporting agent is fixed to the cured film, and therefore, deterioration in charge transportability over time caused by diffusion of the charge transporting agent, which is a low molecular weight compound, between layers, or aggregation of the charge transporting agent may be more effectively suppressed.

T-G      Formula (II)

In Formula (II) above, T represent a residue of a triphenylamine compound, and G represents a polymerizable group selected from the group consisting of a radically polymerizable group and a cationically polymerizable group, or a crosslinkable group.

The radically polymerizable group is preferably a Q-CR=CR$_2$ residue (in which Q represents an electron attracting group) or an olefin CRR=CRR residue. The cationically polymerizable group is preferably a group having an oxirane ring or an oxetane ring. Herein, each R independently represents a hydrogen atom, an alkyl group, an aryl group, an amino group, an alkoxy group, or an aryloxy group. Q represents $R^1C$=O, $R^1SO_2$, or an aromatic heterocyclic group such as 2-pyridyl, pyrimidin-2-yl, or triazin-2-yl. Herein, $R^1$ represents an alkyl group, an aryl group, an amino group, an alkoxy group, or an aryloxy group.

Specific examples of the compound represented by Formula (II) include the compounds shown below.
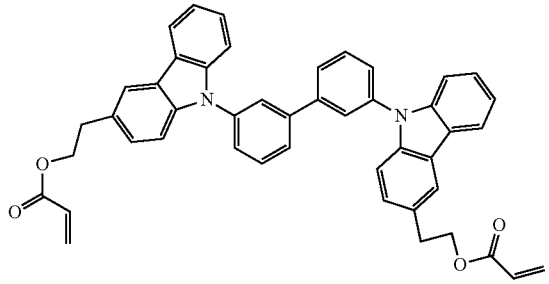
H-27
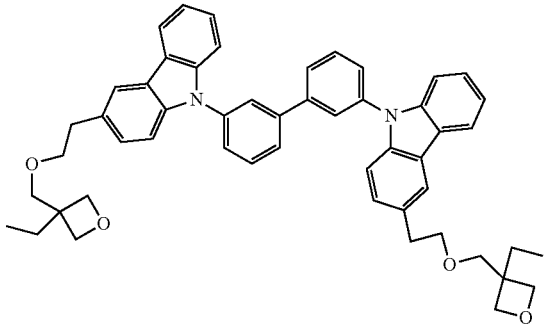
H-28
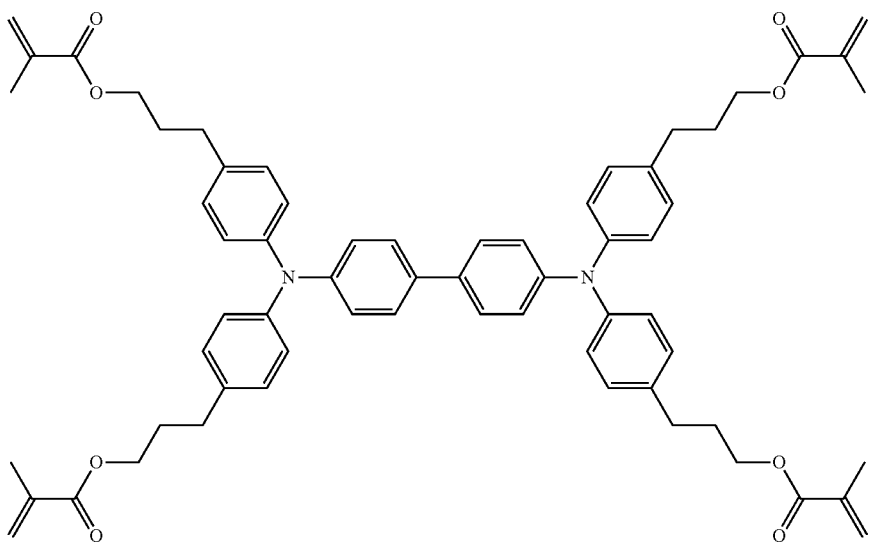
H-29
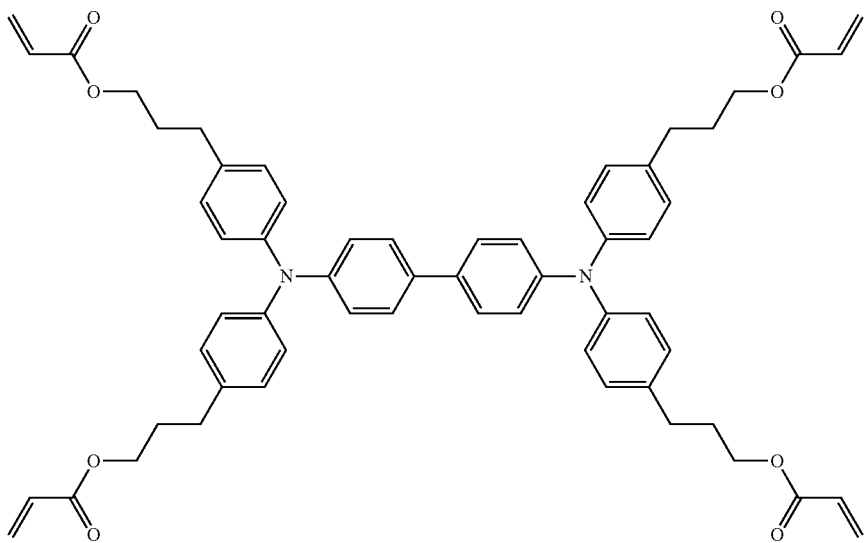
H-30

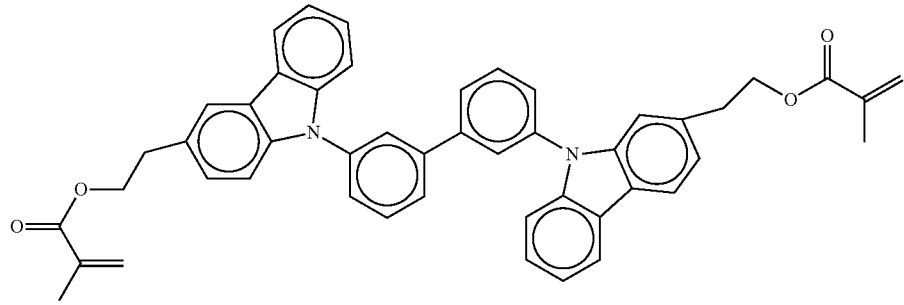
H-31
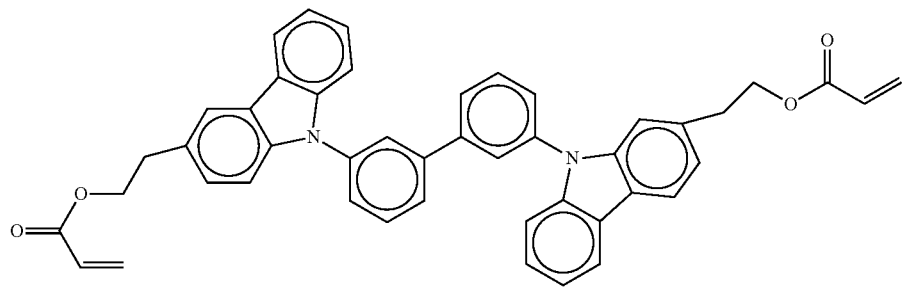
H-32
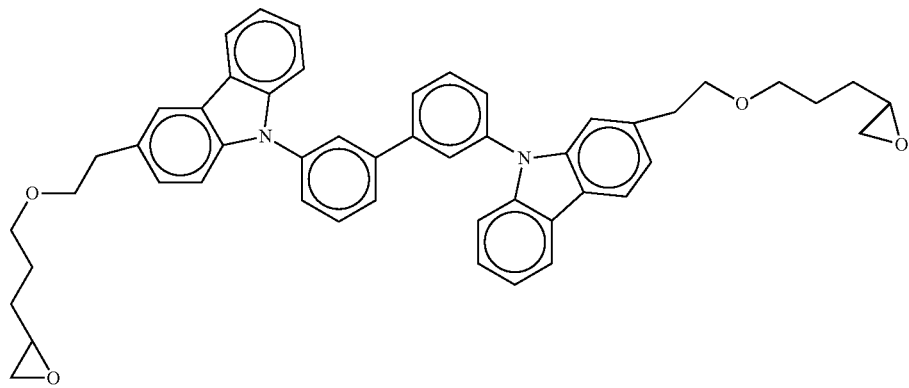
H-33
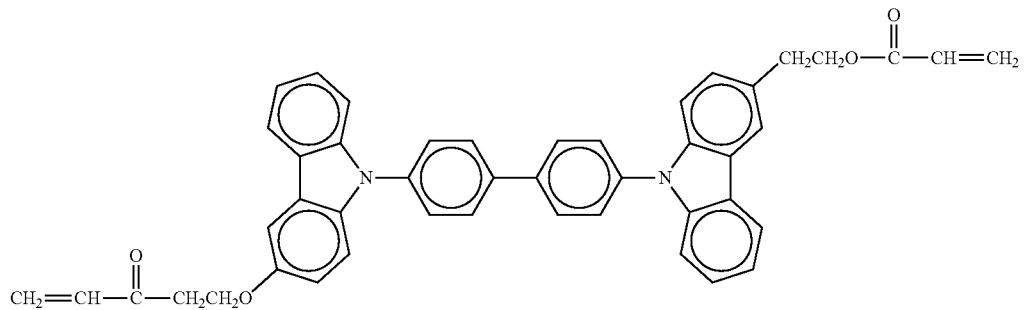
H-34

-continued
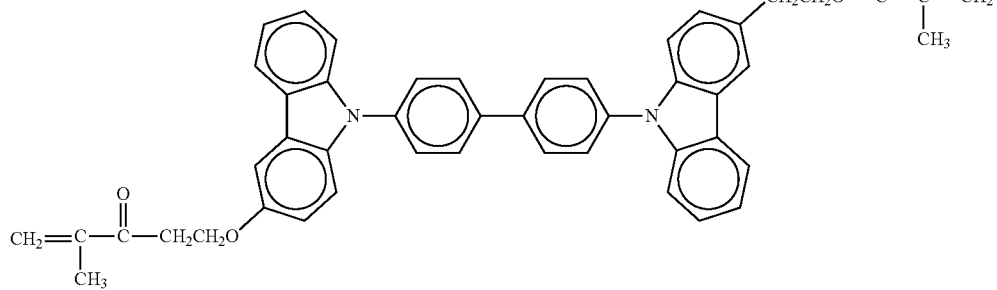
H-35
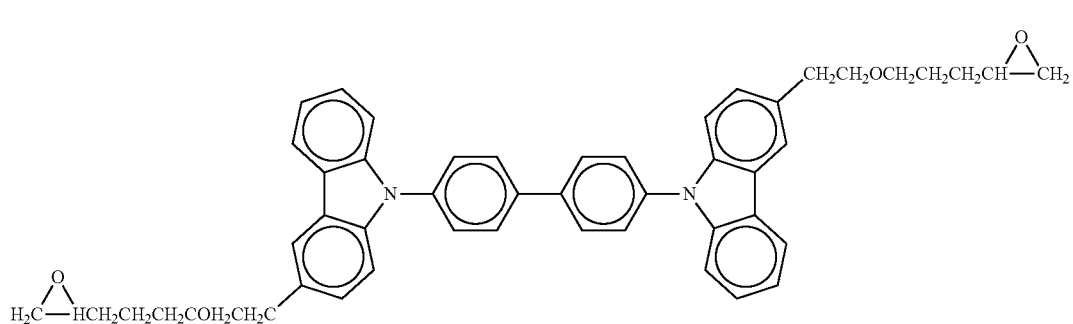
H-36
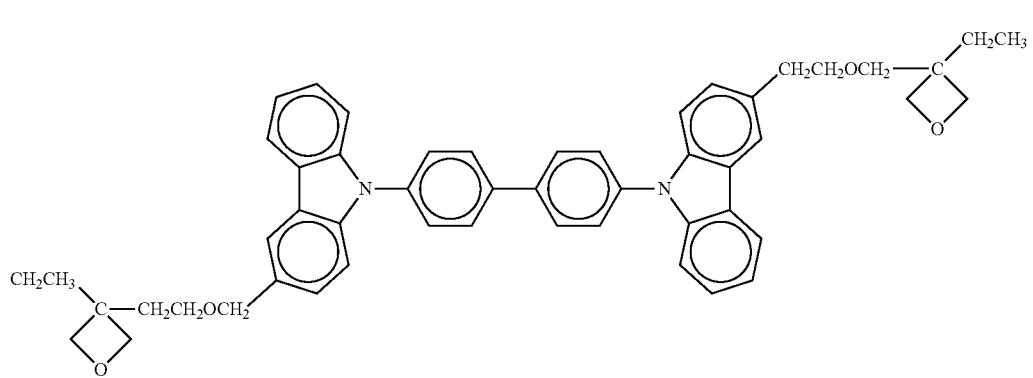
H-37
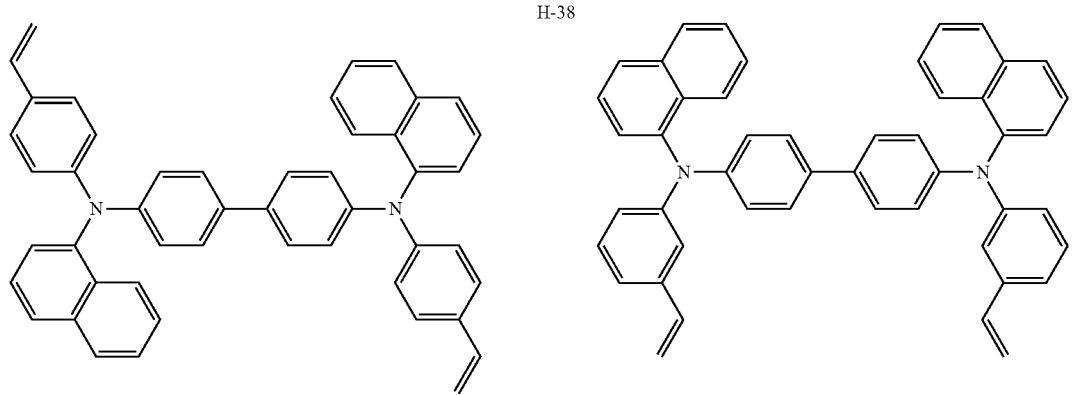
H-38    H-39

-continued
H-40
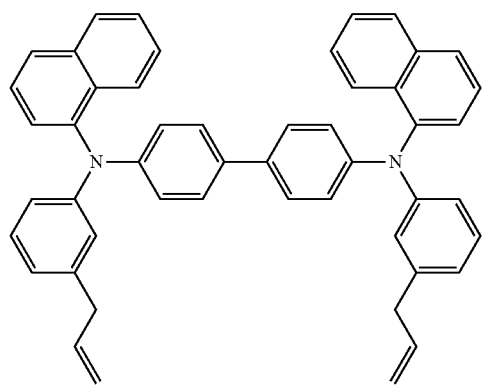
H-41
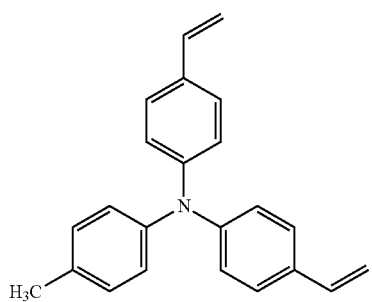
H-42
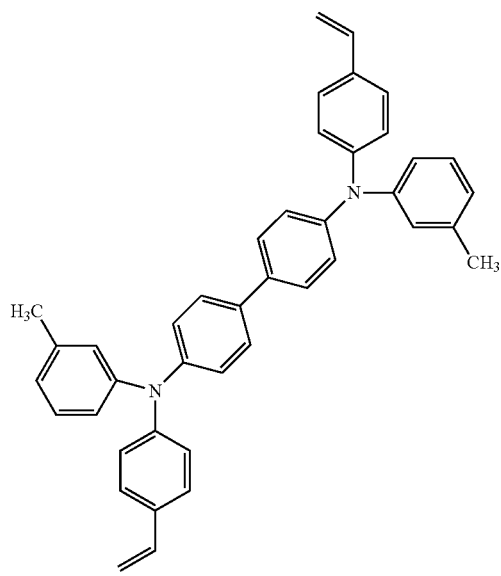
H-43
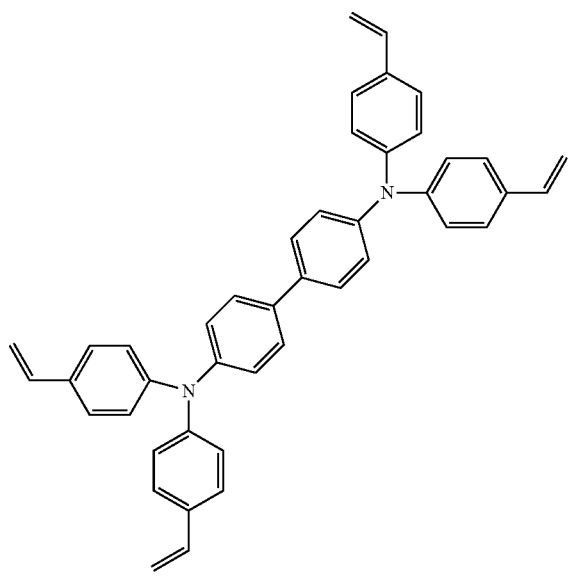
H-44
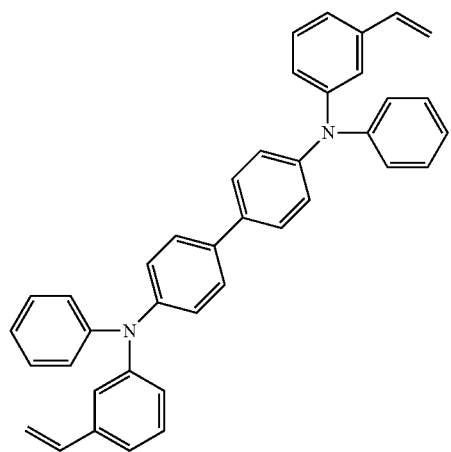
H-45
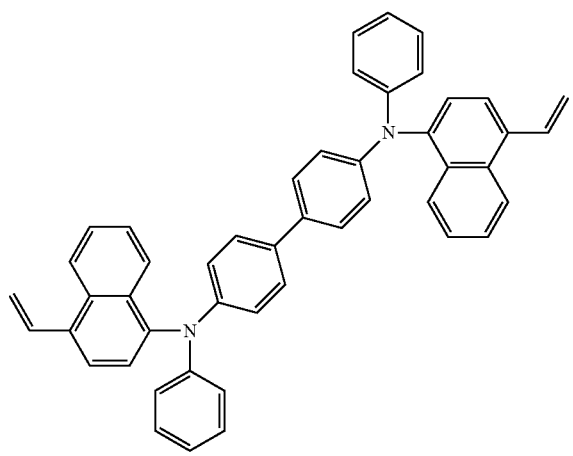

-continued
H-46
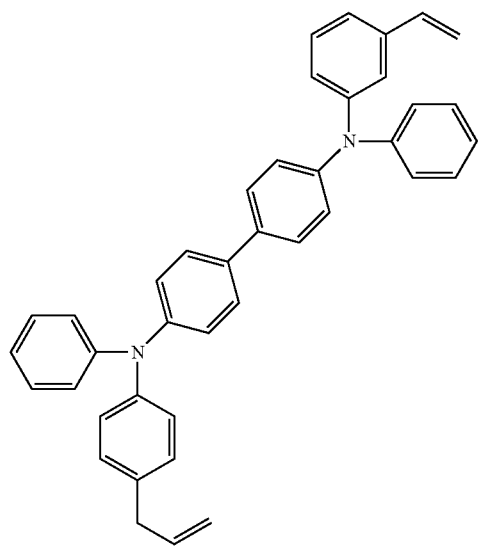
H-47
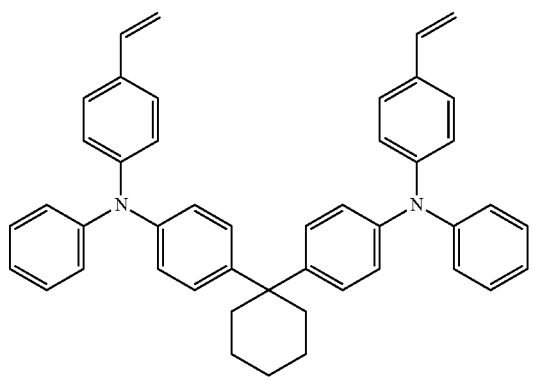
H-48
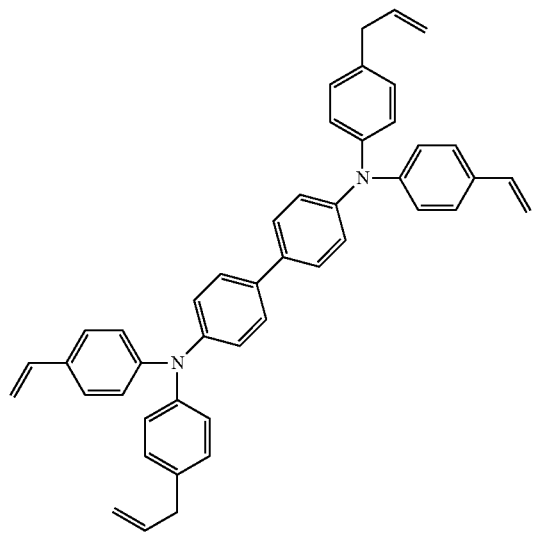
H-49
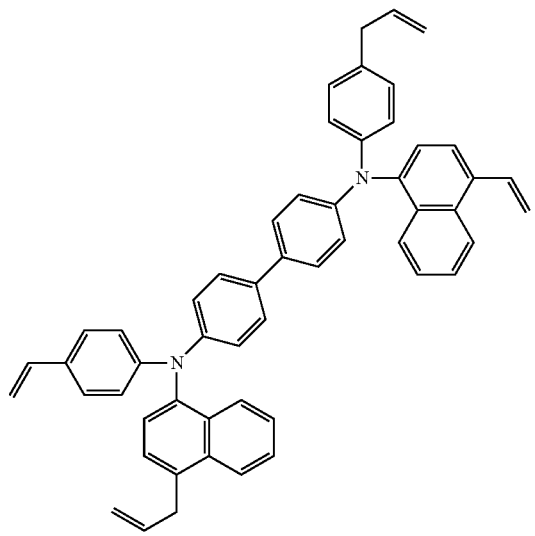
H-50
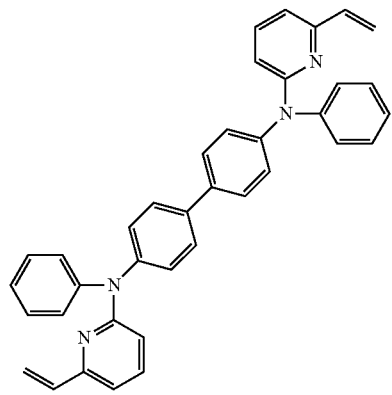
H-51
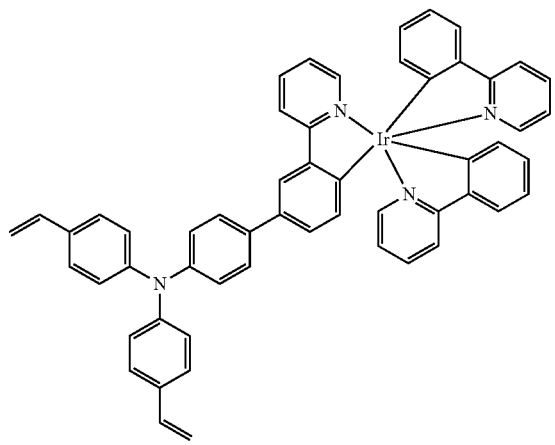

-continued
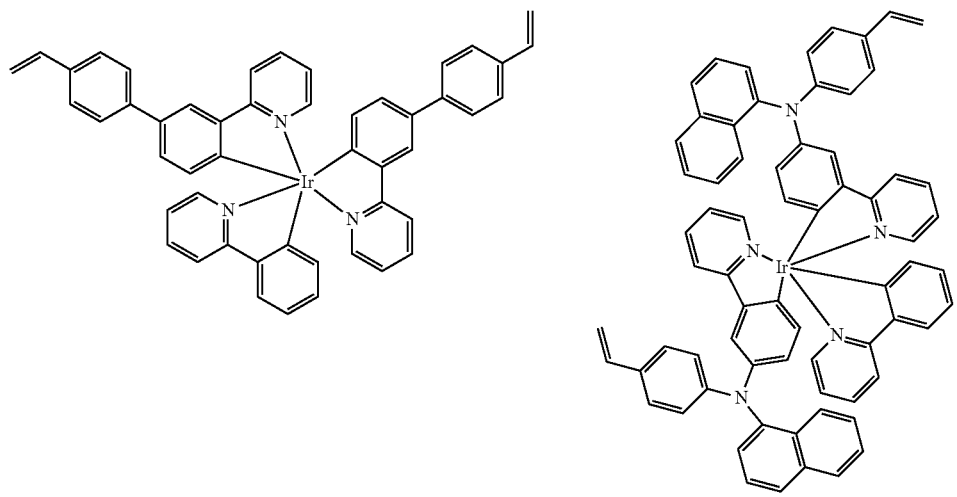
H-52
H-53
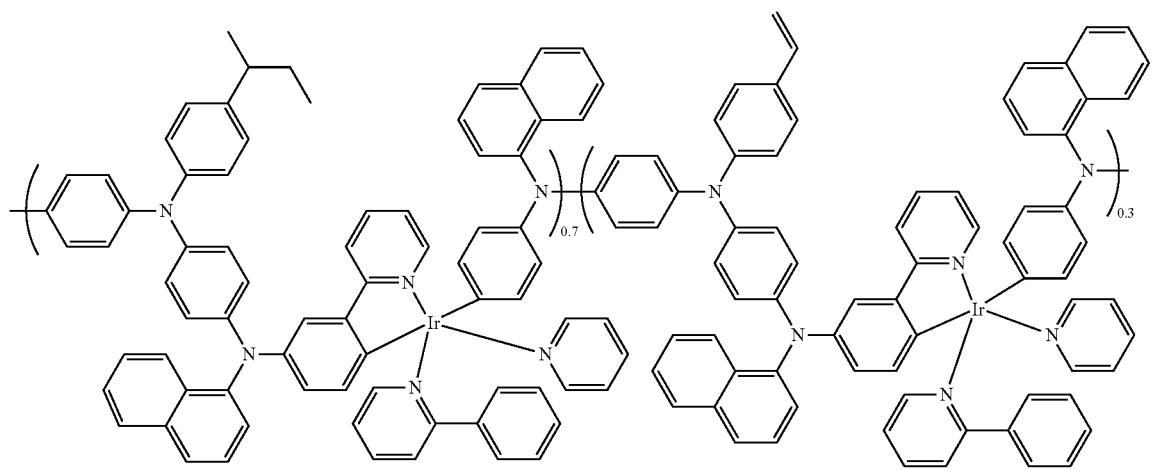
H-54
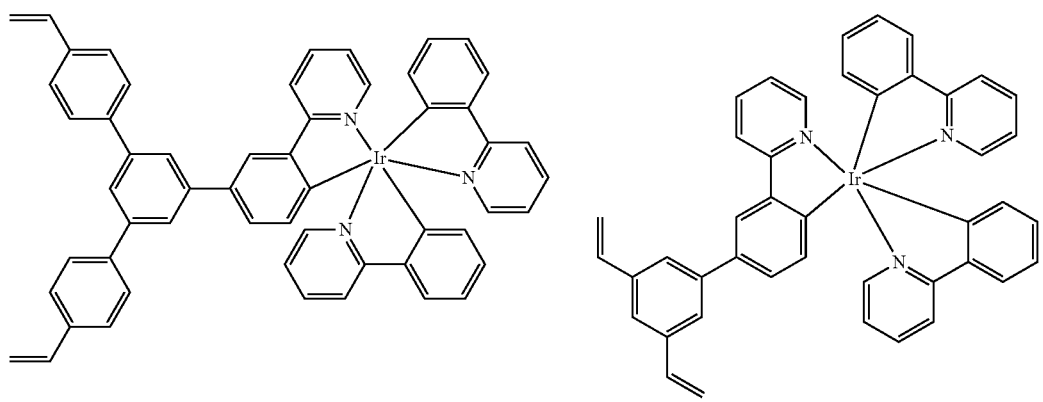
H-55
H-56

H-57
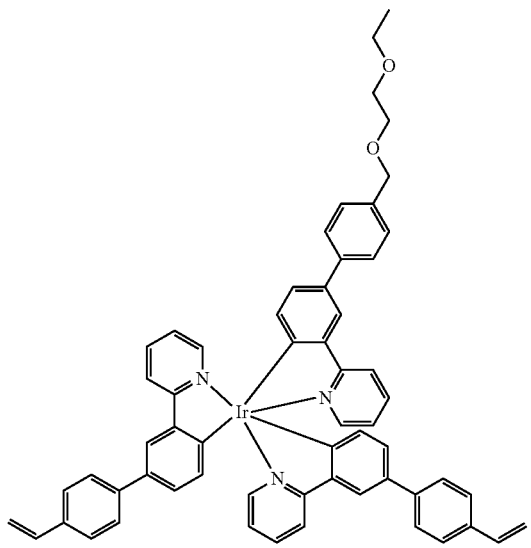
H-58
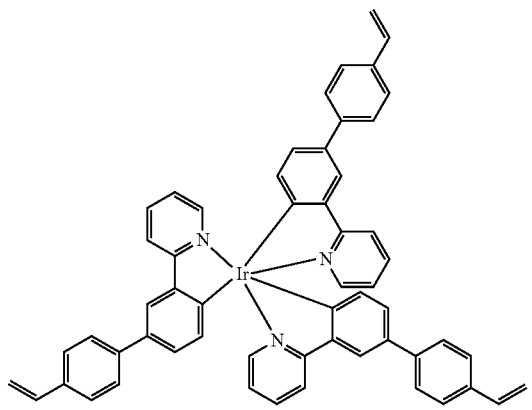
H-59
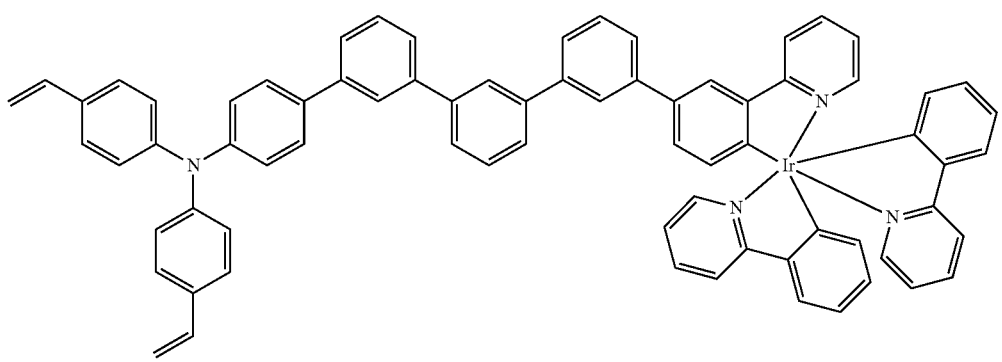
H-60
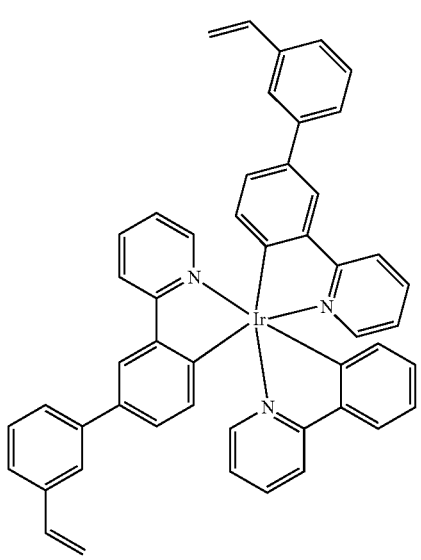

H-61
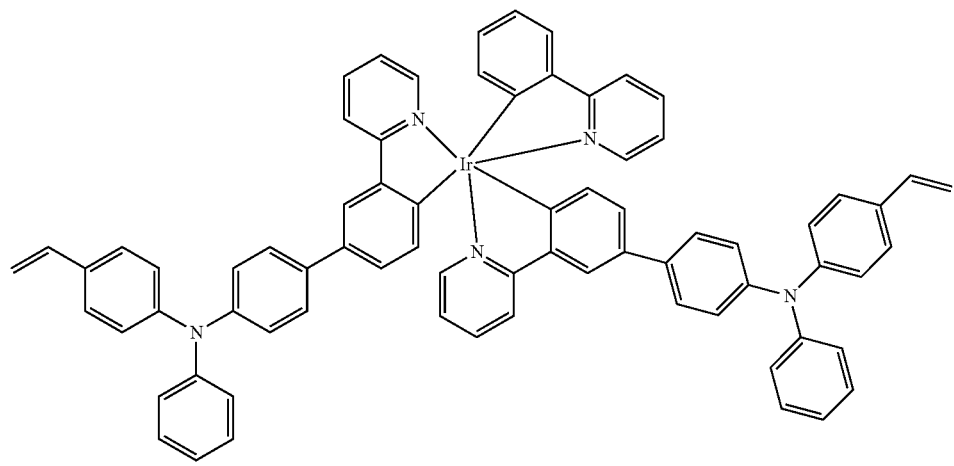
H-62
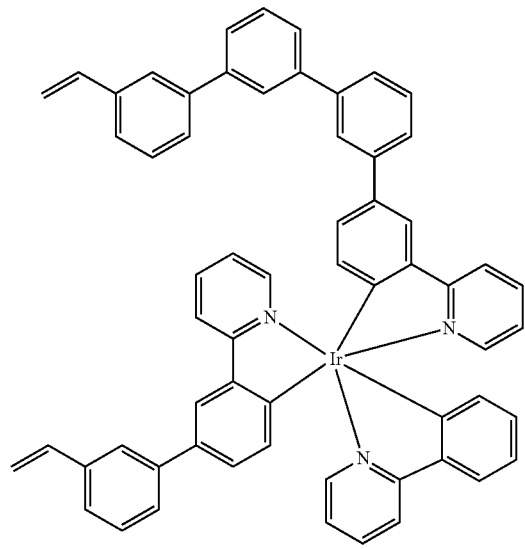
H-63
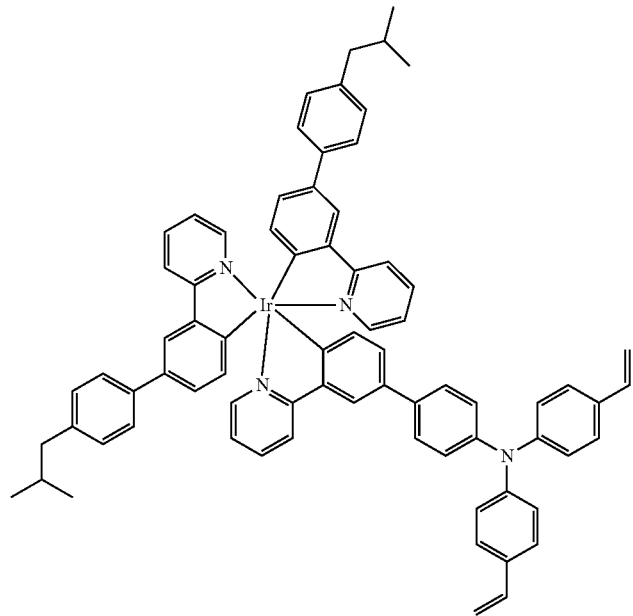

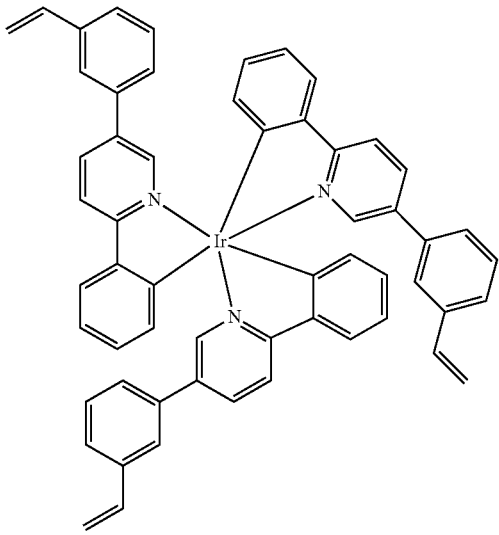

A compound that changes to a charge transporting agent by performing the plasma treatment described below, namely, a charge transporting agent precursor, may be used as the charge transporting agent that is incorporated in the coating film. By subjecting the coating film including the charge transporting agent precursor to the plasma treatment, a charge transporting agent derived from the charge transporting agent precursor is made to exist in the cured film (layer) formed, and the cured layer is made to have charge transportability.

Examples of the charge transporting agent precursor which may be used in the present invention include the compounds shown below.

Examples of a benzo polyphiline precursor include the following compounds.

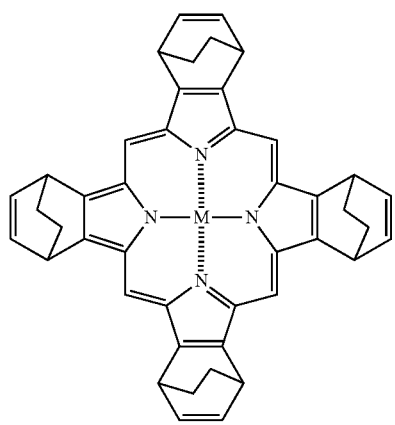

H-64

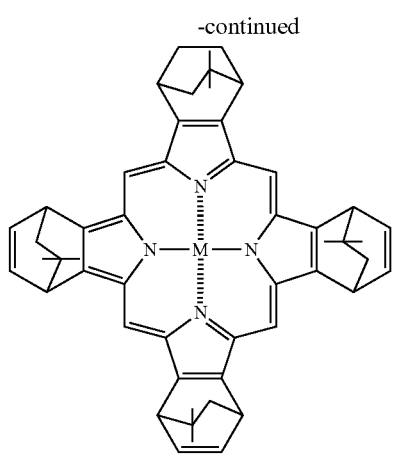

Examples of a naphthalocyanine precursor include the following compounds.

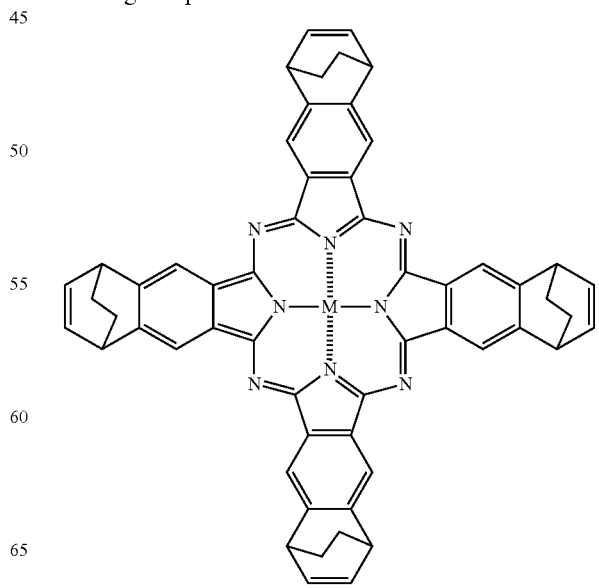

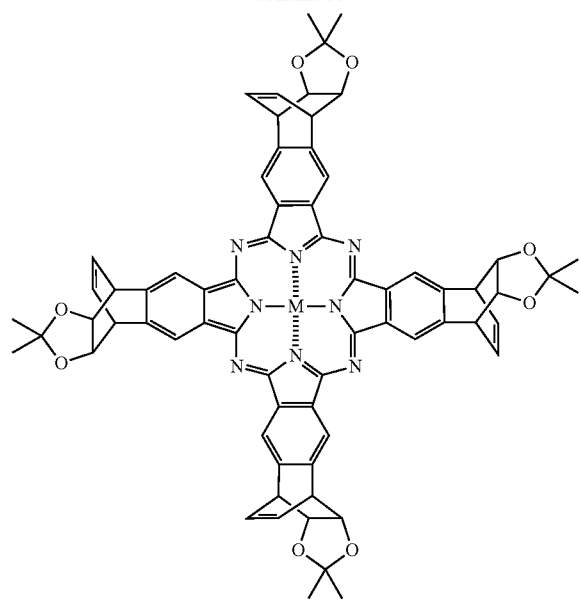
Examples of a phthalocyanine precursor include the following compounds.
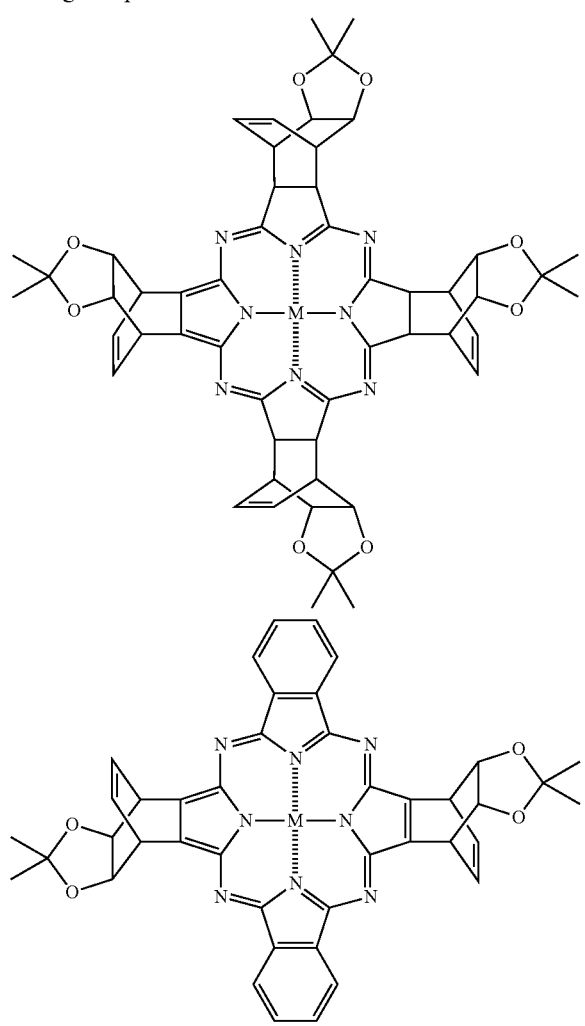
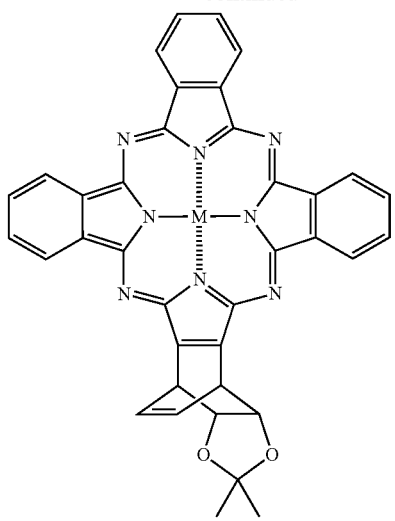
In the above formulae, each M independently represents 2H or a metal atom selected from the group consisting of Mg, Zn, Cu, Ni, Fe, and Co.
Examples of a pentacene precursor include the following compounds.
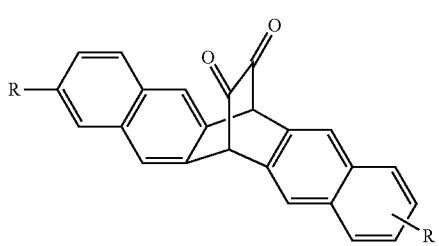
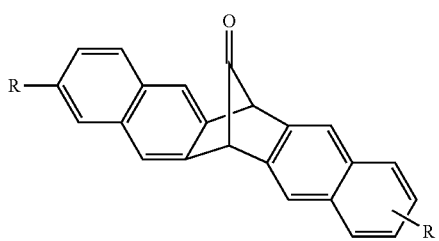
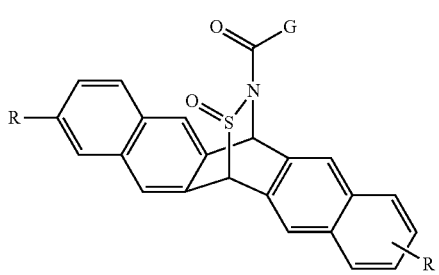
An example of an anthracene precursor is the following compound.

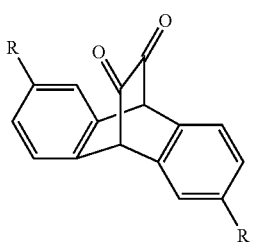

In the above formulae, G represents —CH₃ or —O(CH₂)CH₃, and R represents a hydrogen atom, a bromine atom, or one selected from the substituents shown below. In the case where plural Rs exist in one molecule, Rs may be the same as or different from each other. In the monovalent substituents shown below, a bonding position is shown while regarding R as a bonding hand.

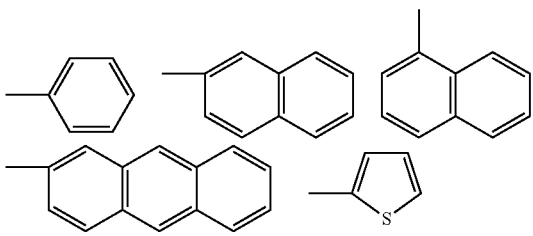

An example of a PEDOT (polyethylenedioxythiophene) precursor is the following compound.

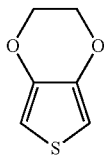

Among the above precursors, benzo polyphiline precursors are preferable.

Since the charge transport film of the present invention is formed by applying an atmospheric pressure low temperature plasma treatment, the charge transport film of the present invention is advantageous in that the charge transport film can contain a material, that is sensitive to temperature changes, as the charge transporting agent. More specifically, a molecule exhibiting liquid crystallinity, in which the structure of the molecule changes when exposed to a high temperature, or the like may be incorporated in the charge transport film.

Examples of the charge transporting agent exhibiting liquid crystallinity include a compound represented by the following Formula (I). Such a compound may also be preferably used in the present invention in which the temperature is not remarkably elevated in the plasma treatment step.

A-G  Formula (I)

In Formula (I) above, A represents a residue of a compound that can exist in the liquid crystalline state; and G represents a polymerizable group selected from the group consisting of radically polymerizable groups and cationically polymerizable groups, or a crosslinkable group.

The radically polymerizable group is preferably a Q-CR=CR₂ residue (in which Q represents an electron attracting group) or an olefin CRR=CRR residue. The cationically polymerizable group is preferably a group having an oxirane ring or an oxetane ring. Herein, each R independently represents a hydrogen atom, an alkyl group, an aryl group, an amino group, an alkoxy group, or an aryloxy group. Q represents $R^1C=O$, $R^1SO_2$, or an aromatic heterocyclic group such as 2-pyridyl, pyrimidin-2-yl, or triazin-2-yl. Herein, $R^1$ represents an alkyl group, an aryl group, an amino group, an alkoxy group, or an aryloxy group.

Among them, a compound represented by Formula (III) is a new charge transportable compound exhibiting liquid crystallinity. The compound represented by Formula (III) can be suitably used in the present invention.

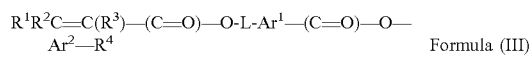

In Formula (III) above, $Ar^1$ and $Ar^2$ each independently represent an arylene group; L represents a divalent linking group selected from the group consisting of alkylene groups having from 1 to 22 carbon atoms, arylene groups having from 6 to 22 carbon atoms, and —O—, or a divalent linking group obtained by combining two or more linking groups selected from the above group; and $R^1$ to $R^4$ each independently represents a hydrogen atom or an alkyl group having from 1 to 8 carbon atoms.

Specific examples of the charge transporting agent exhibiting liquid crystallinity which can be used in the present invention include the compounds shown below. The following exemplary compounds are new compounds.

Compound 1

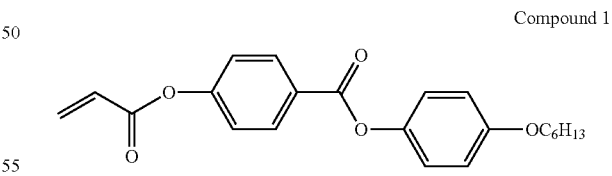

Compound 2

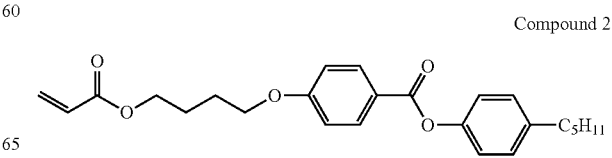

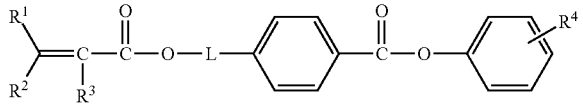
| | R¹ | R² | R³ | L | R⁴ |
|---|---|---|---|---|---|
| Compound No. 3 | H | H | H | —(CH₂)₂— | — |
| Compound No. 4 | H | CH₃ | H | —(CH₂)₃— | CH₃ p-position |
| Compound No. 5 | H | H | H | 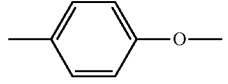 | — |
| Compound No. 6 | H | H | H | 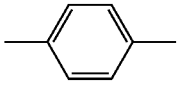 | CH₃ m-position |
| Compound No. 7 | H | H | H | 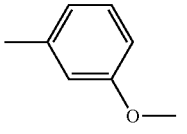 | — |
| Compound No. 8 | H | H | H | 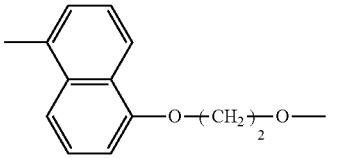 | — |
| Compound No. 9 | H | H | H | 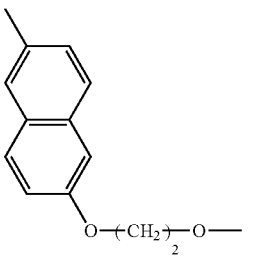 | — |
| Compound No. 10 | H | H | H | —(CH₂)₃—O— | — |
| Compound No. 11 | H | H | H | 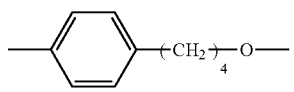 | — |
| Compound No. 12 | H | H | H | —(CH₂)₂—O—(CH₂)₂—O— | — |
| Compound No. 13 | H | H | H | 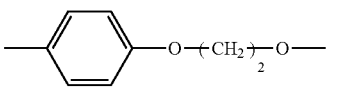 | — |

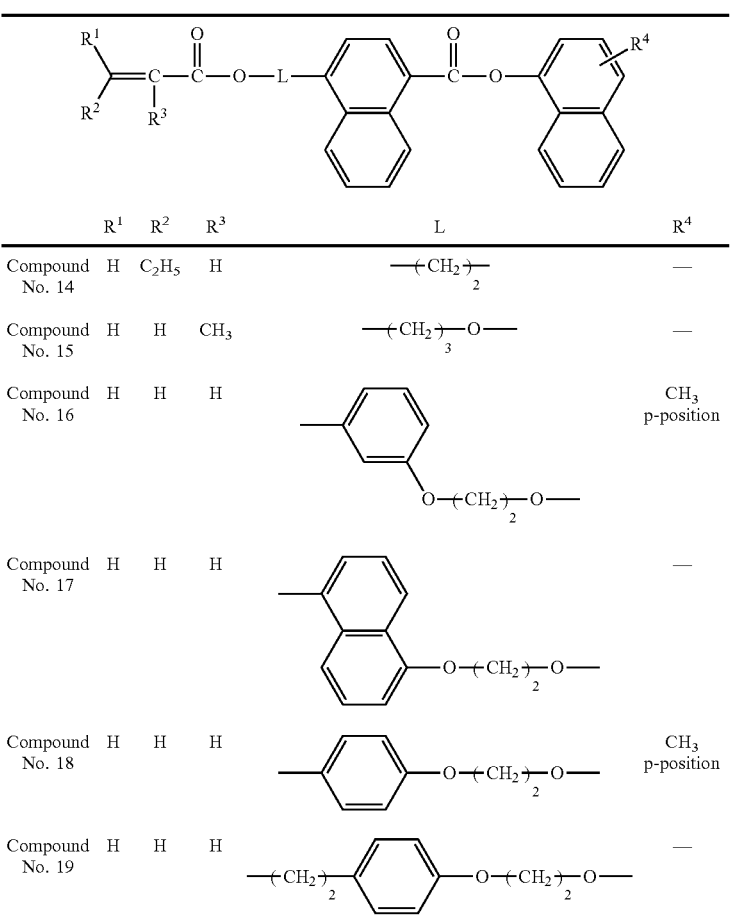
| | R¹ | R² | R³ | L | R⁴ |
|---|---|---|---|---|---|
| Compound No. 14 | H | C₂H₅ | H | —(CH₂)₂— | — |
| Compound No. 15 | H | H | CH₃ | —(CH₂)₃—O— | — |
| Compound No. 16 | H | H | H | —C₆H₃(CH₃)—O—(CH₂)₂—O— | CH₃ p-position |
| Compound No. 17 | H | H | H | —(naphthyl)—O—(CH₂)₂—O— | — |
| Compound No. 18 | H | H | H | —C₆H₄—O—(CH₂)₂—O— | CH₃ p-position |
| Compound No. 19 | H | H | H | —(CH₂)₂—C₆H₄—O—(CH₂)₂—O— | — |
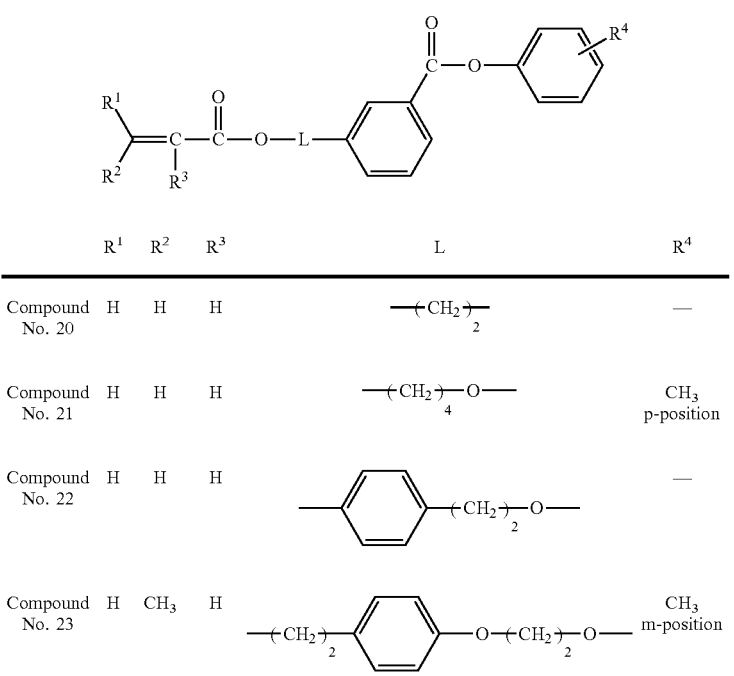
| | R¹ | R² | R³ | L | R⁴ |
|---|---|---|---|---|---|
| Compound No. 20 | H | H | H | —(CH₂)₂— | — |
| Compound No. 21 | H | H | H | —(CH₂)₄—O— | CH₃ p-position |
| Compound No. 22 | H | H | H | —C₆H₄—(CH₂)₂—O— | — |
| Compound No. 23 | H | CH₃ | H | —(CH₂)₂—C₆H₄—O—(CH₂)₂—O— | CH₃ m-position |

-continued

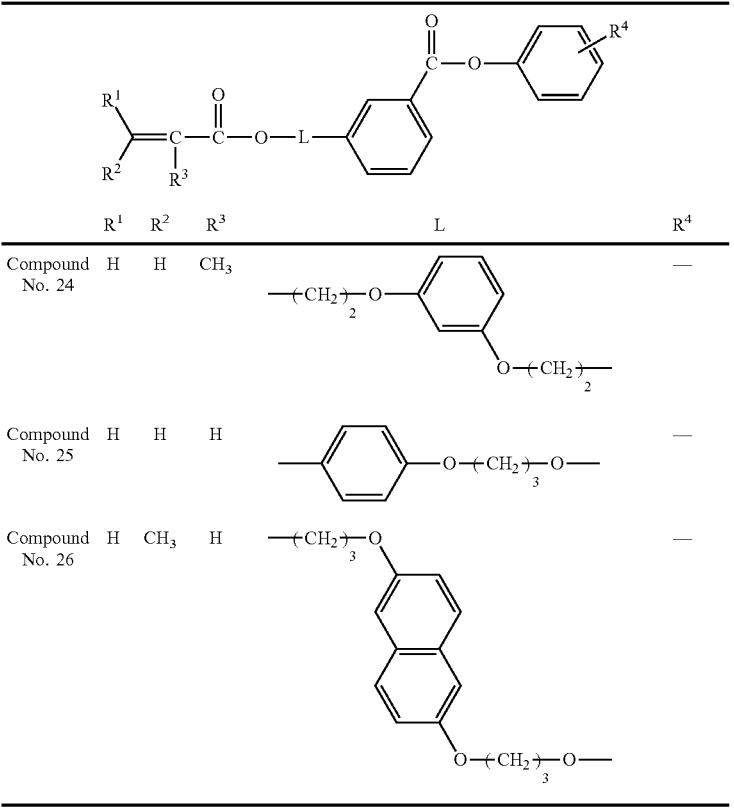

The composition for forming the coating film may contain one of the above charge transporting agents alone, or two or more of them may be used in combination. The content of the charge transporting agent may be appropriately selected according to the physical properties of the charge transport film to be formed, but the content is preferably from about 0.1% by mass to about 90% by mass in terms of solid content.

(Compound Having Crosslinkable Group or Polymerizable Group)

It is preferable that the coating film further includes a compound (a crosslinkable compound) having a crosslinkable group or a polymerizable group, from the viewpoint of curability. The crosslinkable compound which can be used in the present invention is not particularly limited, and may be any of a compound having a cationically polymerizable group or a crosslinkable group, or a compound having a radically polymerizable group or a crosslinkable group. A compound having a radically polymerizable group is preferable from the viewpoint of sensitivity on curing.

The crosslinkable compound may be a monomer, an oligomer, or a polymer, and two or more of them may be used in combination.

Examples of the polymerizable or crosslinkable monomer include radically polymerizable acrylic monomers, for example, acrylates (acrylic acid esters), acrylamides, methacrylates (methacrylic acid esters), or methacrylamides; vinyl monomers (which may be any of radical polymerization or cationic polymerization), for example, vinyl esters such as vinyl acetate, vinyl chlorides, vinyl ethers, or $CH_2=CHOR$ (wherein R represents a substituted or unsubstituted alkyl group, a substituted or unsubstituted cycloalkyl group, a substituted or unsubstituted alkenyl group, a substituted or unsubstituted aryl group, a substituted or unsubstituted aralkyl group, or a substituted or unsubstituted silyl group); styrene monomers, for example, styrene, 1,4-divinylbenzene, or the like; ring-opening polymerization type monomers (cationic polymerization), for example, oxirane (epoxide) compounds, oxetane compounds, or the like; and redox polymerization type monomers, for example, hetroaromatic rings having an excess of electrons (pyrroles or thiophenes).

Further, those having a form of an oligomer or polymer, which is formed by bonding two or more polymerizable monomer molecules, may also be used.

Among them, an acrylic monomer is preferable from the viewpoints of curing speed and stability.

One of these crosslinkable compounds may be incorporated alone in the coating film, or two or more of them may be incorporated in the coating film. Since the charge transport film of the present invention is used for optical elements or the like, it is preferable that impurities are included as few as possible. In the present invention, a cured charge transport film is obtained through polymerization of the crosslinkable compound by performing an atmospheric pressure plasma treatment at a low temperature, and thus, a charge transport film exhibiting excellent strength can be obtained even in the absence of a polymerization initiator. This is one of the advantageous characteristics of the present invention.

The content of the crosslinkable compound in the coating film may be appropriately determined according to the physical properties of the charge transport film to be formed, but generally, the content of the crosslinkable compound is preferably in a range of from 0.5% by mass to 100% by mass.

(Other Components)

The composition for forming the coating film may further contain various additives in addition to the charge transporting agent, the crosslinkable compound, and the solvent, as long as the additives do not damage the effect of the present invention.

(Formation of Coating Film)

A coating film may be formed by preparing a composition for forming a coating film through dissolving the above-described charge transporting agent or crosslinkable compound into the solvent, and then coating the composition onto a predetermined substrate. The substrate is selected according to the use of the charge transport film. For example, in the case of forming a charge transport film of an organic EL element, an ITO (indium tin oxide) substrate or the like is used as the substrate, and in the case of forming a charge transport film of a photoreceptor, a roll-shaped support or the like is used as the substrate.

To form a charge transport film exhibiting excellent durability in accordance with a wet film-forming method is one of the advantageous characteristics of the present invention. The wet coating method may be appropriately selected from known methods according to the purposes. Examples of the wet film forming method which can be used include a dipping method, a spin coating method, a dip coating method, a casting method, a die coating method, a roll coating method, a bar coating method, a gravure coating method, a spray coating method, and an inkjet method.

The coating film formed in accordance with the wet film-forming method may be dried before being applied to the next step. Drying is preferably performed by selecting the conditions such as temperature or pressure, in order not to damage the coating film. Examples of the drying method include vacuum drying at ordinary temperature; and air blow drying using air having a temperature ranging from about 50° C. to about 150° C.

[2. Plasma Treatment Step]

The charge transport film of the present invention may be obtained by curing the coating film which has been formed on a substrate through subjecting the coating film to an atmospheric pressure plasma treatment. The atmospheric pressure plasma treatment in the present invention can use a non-equilibrium plasma jet, low temperature plasma by alternating current pulse discharge, or the like, and in each of which, plasma that is generated under the condition in the vicinity of atmospheric pressure is used.

Concerning the atmospheric pressure plasma apparatus to be used in this step, any apparatus can be used as long as the apparatus can generate low temperature plasma by performing intermittent discharge while supplying an inert gas having a pressure in the vicinity of atmospheric pressure between electrodes that are covered with a dielectric substance. Various variation examples may be selected according to the purpose of use and the like.

Examples the atmospheric pressure plasma apparatus include the apparatus used for plasma treatment on a base in JP-A No. 2008-60115, an ordinary pressure plasma apparatus described in JP-A No. 2004-228136, and plasma apparatuses described in JP-A Nos. 2006-21972 and 2007-188690, the specification of WO2007/145513A1, and the like. Further, atmospheric pressure plasma apparatuses are commercially available and, the atmospheric pressure plasma apparatuses which are now in the market, for example, ATMP-1000 (trade name) manufactured by ARIOS Inc.; an atmospheric pressure plasma apparatus manufactured by Haiden Laboratory Co., Ltd.; 55000 model atmospheric pressure low temperature plasma jet apparatus manufactured by SAKIGAKE-Semiconductor Co., Ltd.; MyPL100 and ILP-1500 (all trade names) manufactured by WELL Corporation; RD550 (trade name) manufactured by Sekisui Chemical Co., Ltd.; and the like can also be suitably used.

However, it is preferable to use an apparatus in which contrivance on the electric circuit has been made such that electricity is conducted to a discharge unit via a pulse control element or the like, as described, for example, in the specifications of WO2005/062338 and WO2007/024134, in order to avoid non-uniform concentration of plasma (streamer), thereby reducing damages to the coating film.

Note that, in the invention, the "pressure in the vicinity of atmospheric pressure" in the "atmospheric pressure plasma" represents a range of from 70 kPa to 130 kPa, and more preferably represents a range of from 90 kPa to 110 kPa.

As the discharge gas that is used at the time of generation of atmospheric pressure plasma, a mixed gas such as atmospheric air may be used, while it is preferable to use a rare gas such as He or Ar, which are each an inert gas, or a nitrogen gas, and it is particularly preferable to use He or $N_2$.

When the plasma generated herein is applied to the surface of the coating film, the crosslinkable compound in the coating film is allowed to perform polymerization and curing caused by plasma, whereby a charge transport film, which contains a charge transporting agent and is a cured film, is formed. By the application of plasma to the surface of the coating film, the polymerization reaction promptly starts and proceeds.

The plasma treatment may be carried out by a batch method or an inline method linking with other steps.

From the viewpoint of suppressing damages on the coating film surface, it is effective to generate a uniform plasma by separating the plasma acting moiety and the discharge moiety or by suppressing the generation of local concentration of plasma (streamer) through making contrivance on the electric circuit. Particularly, the latter is preferable from the viewpoint that plasma processing can be uniformly carried out over a large area. As to the former, a method of conveying plasma generated by discharge to the coating film surface by an inert gas flow and contacting the plasma with the coating film surface is preferable, and particularly, a so-called plasma jet method is preferable. In this case, it is preferable that the path (conducting tube) for conveying the inert gas including plasma is made of dielectrics such as glass, porcelain, or an organic polymer. As to the latter, a method of generating a uniform glow plasma, in which streamer is suppressed by conducting electricity in the electrode covered with dielectrics via a pulse control element, as described in the specifications of WO2005/062338 and WO2007/024134, is preferable.

The distance between the nozzle for supplying the inert gas including plasma and the coating film surface is preferably from 0.01 mm to 100 mm, and more preferably from 1 mm to 20 mm.

Also in the case of the conveyance method using inert gas, plasma can be applied to the coating film surface in accordance with an inline method, substantially similar to the method described in the specification of WO2009/096785. Namely, successive formation of the charge transport film becomes possible by forming a coating film for forming the charge transport film through successively coating onto a substrate surface, and providing a blowout nozzle or the like that can apply inert gas and plasma to the surface at the downstream side in the coating step.

In the case of the plasma generating method using inert gas, the plasma directly functions to the polymerizable groups or the crosslinkable groups that exist in the coating film, whereby polymerization reaction and curing reaction efficiently start and proceed. Accordingly, the method is advantageous in that the polymerization is hardly influenced by oxygen inhibition and good curability can be achieved, even though the polymerization, which generally requires a closed system environment of an inert gas atmosphere for the purpose of suppression against the oxygen inhibition, is carried out in an open system.

From the viewpoint of reducing the amount of chemical species derived from oxygen being taken in at the time of polymerization reaction, it is preferable to sufficiently supply an inert gas to a region to which the plasma treatment is subjected, or to fill the region with an inert gas. When performing such conveyance of plasma by an inert gas, it is preferable to let the inert gas flow at the plasma generating moiety before turning on the plasma, and continue flowing the inert gas even after turning off the plasma.

Concerning the inert gas after the plasma processing treatment, since the life time of plasma is short, the inert gas may be exhausted without performing an exceptional processing, but the inert gas which had been subjected to processing may be collected by providing a suction port in the vicinity of the processing region.

With respect to the temperature for treatment in the plasma treatment step, an arbitrary temperature may be selected according to the characteristics of the material to be subjected to plasma treatment. It is one of preferable characteristics of the invention that temperature elevation due to irradiation with atmospheric pressure low temperature plasma is small. Particularly, by separating the plasma applying region from the plasma generating apparatus, the effect of the invention is more enhanced.

As to the temperature elevation of the material to be processed, namely, the coating film in the present invention, accompanying the plasma treatment, the degree of temperature elevation is preferably 50° C. or less, and more preferably 20° C. or less.

The temperature for treatment is preferably equal to or lower than the temperature at which the material to be processed with the plasma treatment can endure. Specifically, the temperature for plasma treatment of materials, that cannot endure high temperature, such as supports made of a resin or layers coated onto the supports is preferably −196° C. or higher but lower than 150° C., and more preferably from −21° C. to 100° C. A temperature in the vicinity of an ordinary temperature (25° C.) under environmental temperature atmosphere is particularly preferable.

According to the present invention, atmospheric pressure low temperature plasma is selected and used for irradiation in the plasma treatment step, and since the supply amount of heat energy from plasma is small, temperature elevation of the coating film, which is the material to be processed, hardly occurs. For this reason, cured films can be prepared while maintaining a desired liquid crystal phase by carrying out a plasma treatment step as that in the present invention, even in an application to plasma irradiation processing that cannot generally be carried out, such that the case where physical properties change when the temperature gets higher, for example, in an application of forming a charge transport film containing a liquid crystal phase or the like by performing plasma treatment while maintaining a specific temperature in order to make the thermotropic liquid crystal a phase having a specific orderly structure and, at the same time, maintaining the specific liquid crystal phase.

By performing plasma treatment in such a manner, the coating film promptly cures to form a charge transport film containing a charge transporting agent. The charge transport film thus obtained does not contain impurities derived from curing components such as the remaining polymerization initiator and the like, and the surface of the formed film exhibits excellent smoothness as compared with the case of directly irradiating the coating film with plasma. Further, since a high density crosslink structure is formed in the cured film, deterioration in performance caused by aggregation of the charge transporting agent is suppressed, and moreover, also in the case in which other layers are formed in accordance with a coating method after the formation of the charge transport film, undesired diffusion of the charge transporting agent to adjacent layers at the coating film interface is suppressed.

Therefore, according to the production method of the present invention, mutual dissolution at the interface with the adjacent layer or diffusion of low molecular weight components, which generally become problematic in coating methods, is suppressed, and a multilayer structure including the charge transport film may be produced with high productivity in accordance with a coating method or a continuous method.

[Organic Electroluminescence Element]

The light-emitting element of the present invention is characterized in that it has the charge transport film of the present invention. Hereinafter, the light-emitting element of the present invention is explained with reference to the example of the organic electroluminescence element which is a representative embodiment of the light-emitting element.

The organic EL element, which is the light-emitting element of the present invention, is an organic electroluminescence element containing an organic layer between a pair of electrodes, wherein the organic electroluminescence element is equipped with the charge transport film of the present invention as at least one layer of the organic layer.

The organic layer includes a charge transport layer (which is composed of the charge transport film of the present invention) and a light-emitting layer, and the light-emitting layer preferably contains a phosphorescent light emitting compound. The organic layers may include, as necessary, an organic layer other than the charge transport film and the light-emitting layer, a protective layer, a seal layer, and the like.

The charge transport film in the organic electroluminescence element is preferably prepared by the method for producing the charge transport film of the present invention.

The oxygen concentration in the element is preferably as low as possible. Specifically, it is enough that each of the oxygen concentration and moisture concentration in the element is 100 ppm or less, and it is preferable that each of the oxygen concentration and moisture concentration in the element is 50 ppm or less. The method for obtaining an atmosphere in which the concentration of oxygen or moisture is 100 ppm or less is not particularly limited. For example, a sealing step may be carried out under an inert gas atmosphere in which the total concentration of oxygen and the moisture is 100 ppm or less. As the inert gas, nitrogen, argon, or the like is preferable from the viewpoints of costs and easiness in handling.

FIG. 1 is a schematic cross-sectional diagram showing one exemplary embodiment of an organic EL element (hereinafter, may be simply referred to as a light-emitting element), which is one embodiment of the light-emitting element of the present invention. The light-emitting element shown in FIG. 1 has a light-emitting lamination body 7 which is formed by laminating a transparent electrode 2, an organic layer 3, and a rear surface electrode 4 on a substrate 1, and has a sealing member 9 that seals the organic layer 3. In these exemplary embodiments, the sealing member 9 is adhered to the substrate 1, a transparent electrode lead 5, a rear surface electrode lead 6, and the like by using a sealing agent (an adhesive) 8, and is disposed above the light-emitting lamination body 7. A moisture absorbent or an inert liquid may be inserted into a space 10. The moisture absorbent is not particularly limited. Specific examples of the moisture absorbent include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. Specific examples of the inert liquid which can be used include paraffins, liquid paraffins, fluorine-containing solvents (perfluoroalkanes, perfluoroamines, perfluoroethers, and the like), chlorine-containing solvents, and silicone oils.

In the light-emitting (luminescent) element of the invention, a light-emitting lamination body may have a configuration of the following layers and electrodes in this order on a substrate:

a transparent electrode-a light-emitting layer-an electron transport layer-a rear surface electrode, a transparent electrode-a hole transport layer-a light-emitting layer-an electron transport layer-a rear surface electrode, a transparent electrode-a hole transport layer-a light-emitting layer-a rear surface electrode, a transparent electrode-a light-emitting layer-an electron transport layer-an electron injection layer-a rear surface electrode, a transparent electrode-a hole injection layer-a hole transport layer-a light-emitting layer-an electron transport layer-an electron injection layer-a rear surface electrode.

Configurations in which the above layers are disposed in the reverse order are also usable. The charge transport film of the present invention may be disposed in at least one layer of the electron transport layer, the electron injection layer, the hole transport layer, and the hole injection layer. The light-emitting layer contains a phosphorescent light emitting compound. In embodiments, luminescence is usually taken out from the transparent electrode. Specific examples of compounds used in each layer are described, for example, in an extra issue "Organic EL Display" of "Monthly Display" October, 1998 (Techno Times Corp.), and the like.

A position at which the organic layer is to be formed is not particularly limited, and may be appropriately selected according to the application and purposes of the light-emitting element. However, the organic layer is preferably formed on the transparent electrode or on the rear surface electrode. In these cases, the organic layer may be formed on the whole surface or a part of the surface of the transparent electrode or rear surface electrode. A shape, size, and thickness of the organic layer may be appropriately selected depending on the purposes.

At least one layer from among the electron transport layer, electron injection layer, hole transport layer, and hole injection layer in the organic layer is provided in accordance with the method for producing a charge transport film of the present invention. Other layers may be formed by appropriately selecting a wet film-forming method or a dry film-forming method. When a wet film-forming method is employed, an organic layer having a large area may be easily formed, and a light-emitting element which exhibits high brightness and excellent light emission efficiency may be efficiently obtained with low costs, which is preferable. As to the dry film-forming method that may be used when forming other layers, a deposition method, a sputtering method, or the like can be used.

The wet film-forming method is as described above. These film-forming methods may be appropriately selected depending on the material of the organic layer. In the case where film formation is performed by a wet film-forming method, drying may be carried out after the film formation. Drying is carried out by selecting the conditions such as temperature, pressure, and the like, in consideration of not damaging the coated layer.

A coating liquid used in the above wet film-forming method (coating process) usually includes a material for forming the organic layer and a solvent for dissolving or dispersing the material. The solvent is not particularly limited, and may be selected according to the material used for the organic layer. Specific examples of the solvent include those described as the specific examples of the solvent in the method for preparing a coating film described above. The amount of solid matter with respect to the solvent in the coating liquid is not particularly limited, and the viscosity of the coating liquid may arbitrarily be selected according to the film-forming method.

The light-emitting element of the invention usually emits light when a direct current voltage (alternating current components may be contained) in a range of from about 2 volts to about 40 volts or a direct current is applied between the transparent electrode and the rear surface electrode. Further, for driving the light-emitting element of the invention, the driving methods described in JP-A Nos. 2-148687, 6-301355, 5-29080, 7-134558, 8-234685, and 8-241047, U.S. Pat. Nos. 5,828,429 and 6,023,308, Japanese Patent No. 2784615, and the like may be utilized. Hereinafter, each layer constituting the light-emitting lamination body used in the invention is explained in detail. However, it should be construed that the present invention is not limited thereto.

(A) Substrate

Concerning the substrate to be used in the light-emitting element of the present invention, substrates used in known light-emitting elements can be used, depending on the purposes. Above all, a substrate made of a material that is impermeable to moisture, or a material that is very slightly permeable to moisture is preferable. Moreover, it is preferable that the material for the substrate does not scatter or attenuate light emitted from the organic layer. Specific examples of the material for the substrate include inorganic materials such as zirconia-stabilized yttrium (YSZ) and glass; and organic materials such as polyesters such as polyethylene terephthalate, polybutylene terephthalate, and polyethylene naphthalate, polystyrene, polycarbonate, polyethersulfone, polyarylate, allyl diglycol carbonate, polyimide, polycycloolefin, a norbornene resin, and poly (chlorotrifluoroethylene).

Among them, particularly preferably, an organic material that has an excellent thermal resistance, dimensional stability, solvent resistance, electric insulating property and workability, and has a low gas permeability and low hygroscopic property may be used. The substrate may be formed from a single material or may be formed from two or more materials. The material for forming the substrate may be appropriately selected according to the material of the transparent electrode. For instance, in a case in which indium tin oxide (ITO) is used as the transparent electrode, it is preferable to use a material which shows a small difference in the lattice constant against ITO.

The shape, the structure, the size, or the like of the substrate may be appropriately selected according to the application and purposes of the light-emitting element. As to the shape of the substrate, a plate-like substrate is generally used. The structure of the substrate may be a monolayer structure or a laminate structure. Although the substrate may be either transparent and colorless, or transparent and colored, it is preferable that the substrate is transparent and colorless from the viewpoint that the substrate does not scatter or attenuate light emitted from the light-emitting layer.

A moisture permeation preventive layer (a gas barrier layer) may be provided on a surface of the substrate at the electrode side, on a surface of the substrate at the opposite side from the electrode side, or on the two surfaces. As a material for forming the moisture permeation preventive layer, an inorganic substance such as silicon nitride or silicon oxide is preferably employed. The moisture permeation preventive layer may be formed in accordance with a high-frequency sputtering method or the like. Further, as needs arise, a hard-coat layer or an undercoat layer may be provided on the substrate.

(B) Transparent Electrode

In general, a transparent electrode has a function as an anode that supplies holes to an organic layer. However, a transparent electrode can also function as a cathode, and in this case, a rear surface electrode functions as an anode. Hereinafter, the case in which the transparent electrode is provided as an anode is explained.

There is no particular limitation as to the shape, the structure, the size, or the like of the transparent electrode, and it may be appropriately selected according to the application and purposes of the light-emitting element. Examples of a material for forming the transparent electrode which can be used include metals, alloys, metal oxides, electrically conductive compounds, and mixtures thereof. Materials having a work function of 4 eV or more are preferably used.

A position at which the transparent electrode is to be formed may be appropriately selected according to the application and purposes of the light-emitting element, but the transparent electrode is preferably formed on the substrate. In this case, the transparent electrode may be formed on either the whole surface of the substrate or a part of the surface of the substrate.

A thickness of the transparent electrode may be appropriately selected according to the material constituting the transparent electrode. The thickness is usually from 10 nm to 50 μm, and preferably from 50 nm to 20 μm. The resistivity of the transparent electrode is preferably $10^2 \Omega/\square$ or less, and more preferably $10 \Omega/\square$ or less. The transparent electrode may be either transparent and colorless, or transparent and colored. For extracting luminescence from the transparent electrode side, the transmittance of the transparent electrode is preferably 60% or higher, and more preferably 70% or higher. The transmittance can be measured in accordance with a known method using a spectrophotometer.

Further, electrodes described in detail in "TOUMEI DODENMAKU NO SHINTENKAI (Novel Developments in Transparent Electrically Conductive Films)" (edited by Yutaka Sawada, published by C.M.C. in 1999) and the like may also be applied to the invention. Particularly, in the case of using a plastic substrate having a low thermal resistance, it is preferable to use ITO or IZO (indium zinc oxide) as the transparent electrode material and to perform film formation at a low temperature of 150° C. or lower.

(C) Rear Surface Electrode

In general, a rear surface electrode has a function as a cathode that injects electrons to an organic layer. However, a rear surface electrode can also function as an anode, and in this case, the above-described transparent electrode functions as a cathode. Hereinafter, the case in which the rear surface electrode is provided as a cathode is explained.

There is no particular limitation as to the shape, the structure, the size, or the like of the rear surface electrode, and it may be appropriately selected according to the application and purposes of the light-emitting element. Examples of a material for forming the rear surface electrode which can be used include metals, alloys, metal oxides, electrically conductive compounds, and mixtures thereof. Materials having a work function of 4.5 eV or less are preferably used.

Specifically, as examples of the material, alkali metals and alkaline earth metals are preferable from the viewpoint of electron injectability, and materials containing aluminum as a major component are preferable from the viewpoint of storage stability. Here, the expression "materials containing aluminum as a major component" refers to materials constituted by aluminum alone; alloys including aluminum and 0.01% by mass to 10% by mass of an alkali metal or an alkaline earth metal; or mixtures thereof (lithium-aluminum alloys, magnesium-aluminum alloys, and the like). As materials of the rear surface electrode, those described in detail in JP-A Nos. 2-15595 and 5-121172, and the like can also be used.

The rear surface electrode may be formed in accordance with a wet method such as a coating method; a physical method such as a vacuum deposition method, a sputtering method, or an ink plating method; a chemical method such as a CVD (chemical vapor deposition) method or a plasma CVD method; or the like. In a case in which two or more metals or the like are used as the materials of the rear surface electrode, these materials may be sputtered at the same time or sequentially to form a rear surface electrode.

Patterning of the rear surface electrode can be carried out by chemical etching such as photolithography, physical etching such as etching using laser, or the like. Further, patterning may be carried out by vacuum deposition or sputtering using a mask, or a lift-off method, a printing method, or the like.

A position at which the rear surface electrode is to be formed may be appropriately selected according to the application and purposes of the light-emitting element, but the rear surface electrode is preferably formed on the organic layer. In this case, the rear surface electrode may be formed on either the whole surface of the organic layer or a part of the surface of the organic layer. Further, a dielectric layer made of a fluoride of an alkali metal or an alkaline earth metal or the like may be disposed between the rear surface electrode and the organic layer at a thickness of from 0.1 nm to 5 nm. The dielectric layer may be formed in accordance with a vacuum deposition method, a sputtering method, an ion plating method, or the like.

A thickness of the rear surface electrode may be appropriately selected according to the material constituting the rear surface electrode. The thickness is usually from 10 nm to 5 μm, and preferably from 50 nm to 1 μm. The rear surface electrode may be either transparent or opaque. A transparent rear surface electrode may be formed by preparing a layer of the above material with a thickness of from 1 nm to 10 nm, thereby forming a thin film, and then, further laminating a transparent electrically conductive material such as ITO or IZO thereon.

(D) Light-Emitting Layer

In the light-emitting element of the present invention, the light-emitting layer contains a phosphorescent light emitting compound and the like. The phosphorescent light emitting compound used in the present invention is not particularly limited as long as the compound can emit light from a triplet exciton. As the phosphorescent light emitting compound, an ortho-metalated complex or a porphyrin complex is preferably used, and more preferably, an ortho-metalated complex is used. Among the porphyrin complexes, porphyrin platinum complexes are preferable. The phosphorescent light emitting compounds may be used alone or in a combination of two or more of them.

The light emitting material according to the invention may have a polymerizable group. Examples of the polymerizable group may include acrylate, methacrylate, vinyl, vinyl ether, epoxy, oxetane, alkoxysilane, isocyanate, and a hydroxy group.

The ortho-metalated complex used in the invention can be synthesized according to known techniques such as those described in Inorg. Chem., vol. 30, page 1685, 1991; Inorg. Chem., vol. 27, page 3464, 1988; Inorg. Chem., vol. 33, page 545, 1994; Inorg. Chim. Acta, vol. 181, page 245, 1991; J. Organomet. Chem., vol. 335, page 293, 1987; and J. Am. Chem. Soc., vol. 107, page 1431, 1985.

The content of the phosphorescent light emitting compound in the light-emitting layer is not particularly limited, but the content is, for example, from 0.1% by mass to 70% by mass, and preferably from 1% by mass to 20% by mass. When the content of the phosphorescent light emitting compound is less than 0.1% by mass or when the content exceeds 70% by mass, there are cases where the effect of the phosphorescent light emitting compound is not sufficiently demonstrated.

In the present invention, the light-emitting layer may contain a host compound, a hole transport material, an electron transport material, an electrically inactive polymer binder, or the like, as necessary.

The host compound is a compound that has a function of causing an energy transfer from an excited state thereof to the phosphorescent light emitting compound, and as a result, causes light emission from the phosphorescent light emitting compound.

Specific examples of the host compound preferably include carbazole derivatives and arylamine derivatives.

The hole transport material is not particularly limited as long as the material has any of: a function of injecting holes from the anode, a function of transporting holes, and a function of blocking electrons injected from the cathode. The hole transport material may be either a low molecular weight material or a high molecular weight material. Specific examples of the hole transport material which can be used in the light-emitting element may include those described as the specific examples of the hole transport material in the above description of the charge transporting agent.

The hole injection layer preferably contains a dopant which becomes a carrier to transfer holes. As the dopant to be introduced into the hole injection layer, either of an inorganic compound or an organic compound may be used as long as the compound has an electron accepting property and a property for oxidizing an organic compound. Specifically, a Lewis acid compound such as ferric chloride, aluminum chloride, gallium chloride, indium chloride, or amtimony pentachloride may be preferably used as the inorganic compound.

In the case of using an organic compound, a compound having, as a substituent, a nitro group, halogen, a cyano group, a trifluoromethane group, or the like; a quinone compound; an acid anhydride compound; fullerene; or the like may be preferably used.

The electron transport material is not particularly limited as long as the material has any of: a function of injecting electrons from the cathode, a function of transporting electrons, and a function of blocking holes injected from the anode. Specific examples of the electron transport material which can be used in the present invention may include the electron transport materials described above as the charge transporting agent.

Examples of the polymer binder which may be used for forming the light-emitting element of the invention include polyvinyl chloride, polycarbonate, polystyrene, polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, vinyl acetate, an ABS (acrylonitrile-butadiene-styrene) resin, polyurethane, a melamine resin, an unsaturated polyester compound, an alkyd resin, an epoxy resin, a silicone resin, polyvinyl butyral, and polyvinyl acetal. The light-emitting layer containing the polymer binder may be formed by coating to have a large area, easily, in accordance with a wet film-forming method.

The thickness of the light-emitting layer in the organic EL element is preferably from 10 nm to 200 nm, and more preferably from 20 nm to 80 nm. When the thickness is over 200 nm, the drive voltage may be increased. On the other hand, when the thickness is less than 10 nm, the organic EL element may be short-circuited.

(E) Electron Transport Layer

The light-emitting element of the present invention may have an electron transport layer including the above-described electron transport material, as necessary. In the case of disposing an electron transport layer, the electron transport layer may be composed of the charge transport film of the present invention. The electron transport layer may contain the above-described polymer binder. A thickness of the electron transport layer is preferably from 10 nm to 200 nm, and more preferably from 20 nm to 80 nm. When the thickness exceeds 200 nm, the driving voltage may be increased, and when the thickness is less than 10 nm, the light-emitting element may be short-circuited.

(F) Hole Transport Layer

The light-emitting element of the present invention may have a hole transport layer including the above-described hole transport material, as necessary. In the case of disposing a hole transport layer, the hole transport layer may be composed of the charge transport film of the present invention. The hole transport layer may contain the above-described polymer binder. A thickness of the hole transport layer is preferably from 10 nm to 200 nm, and more preferably from 20 nm to 80 nm. When the thickness exceeds 200 nm, the driving voltage may be increased, and when the thickness is less than 10 nm, the light-emitting element may be short-circuited.

(G) Others

The light-emitting element of the invention may have a protective layer described in JP-A Nos. 7-85974, 7-192866, 8-22891, 10-275682, and 10-106746, and the like. The protective layer is formed on the uppermost surface of the light-emitting element. Herein, the uppermost surface means the outer surface of a rear surface electrode in the case of laminating the substrate, transparent electrode, organic layer, and rear surface electrode in this order, while the uppermost surface means the outer surface of a transparent electrode in the case of laminating the substrate, rear surface electrode, organic layer, and transparent electrode in this order. The shape, the size, the thickness, and the like of the protective layer each are not particularly limited. The material constituting the protective layer is not particularly limited, and may be one having a function of preventing penetration or permeation of substances such as moisture and oxygen, which may deteriorate the light-emitting element, into the element. Specifically, silicon oxide, silicon dioxide, germanium oxide, germanium dioxide, or the like may be used.

[Sealing]

Further, it is preferable that a sealing layer for preventing penetration of moisture or oxygen is provided in the light-emitting element. Examples of a material for forming the sealing layer, which can be used, include copolymers obtained by copolymerization using tetrafluoroethylene and at least one comonomer; fluorine-containing copolymers each having a cyclic structure in the copolymer main chain; polyethylene; polypropylene; polymethyl methacrylate; polyimide; polyurea; polytetrafluoroethylene; polychlorotrifluoroethylene; polydichlorodifluoroethylene; copolymers obtained by copolymerization using chlorotrifluoroethylene or dichlorodifluoroethylene and other comonomer; water absorbing substances each having a coefficient of water absorption of 1% or more; moisture permeation preventive substances each having a coefficient of water absorption of 0.1% or less; metals (In, Sn, Pb, Au, Cu, Ag, Al, Tl, Ni, and the like); metal oxides (MgO, SiO, $SiO_2$, $Al_2O_3$, GeO, NiO, CaO, BaO, $Fe_2O_3$, $Y_2O_3$, $TiO_2$, and the like); metal fluorides ($MgF_2$, LiF, $AlF_3$, $CaF_2$, and the like); liquid-state fluorinated carbons (perfluoroalkane, perfluoroamine, perfluoroether and the like); and substances each obtained by dispersing a moisture absorbing agent or an oxygen absorbing agent in the liquid-state fluorinated carbon.

The organic EL elements of the invention emit light when a direct current (, which may include an alternating current component as necessary) voltage (usually from 2 V to 15 V) or direct current is applied between the anode and the cathode.

As for the driving method of the organic EL elements of the invention, the driving methods described in JP-A Nos. 2-148687, 6-301355, 5-29080, 7-134558, 8-234685, and 8-241047, Japanese Patent No. 2784615, and U.S. Pat. Nos. 5,828,429 and 6,023,308 can be applied.

[Photoelectric Conversion Element]

The photoelectric conversion element of the present invention is characterized in that it is equipped with the charge transport film of the present invention.

Namely, another preferable embodiment with respect to the application of the charge transport film of the present invention is an application to a charge transport film in a photoelectric conversion element such as an organic thin-film solar battery.

There is no particular limitation as to the configuration of the organic thin-film solar battery. For example, the charge transport film of the present invention can be applied as a hole transport layer of an organic thin-film solar battery having: a transparent electrode, for example, a mesh electrode; a hole transport layer which is formed at least at the opening of the transparent electrode and has a function for transporting holes; a photoelectric conversion layer which is formed on the transparent electrode and the hole transport layer; and a counter electrode which is formed on the photoelectric conversion layer, as described in JP-A No. 2009-76668.

Here, it is preferable that the hole transport layer contains polyethylenedioxythiophene (hereinafter, arbitrarily referred to as PEDOT)/polystyrenesulfonic acid (hereinafter, arbitrarily referred to as PSS) as the charge transporting agent. PEDOT/PSS has excellent electric conductivity, and exhibits excellent charge transferability in the film surface direction in the charge transport film.

Figure 2:
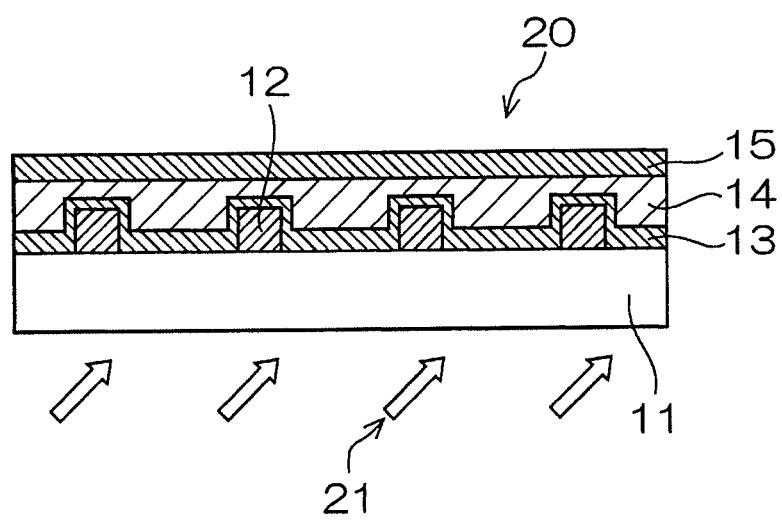
FIG. 2 is a schematic cross-sectional diagram showing one exemplary embodiment of an organic thin-film solar battery, which is an application form of a photoelectric conversion element of the present invention.

FIG. 2 is a schematic cross-sectional diagram showing one example of an organic thin-film solar battery, which is the photoelectric conversion element of the present invention. It should be noted that, here, a transparent electrode having a form of a meshed shape is explained as an example, but the form of the transparent electrode is not limited thereto.

In the example shown in FIG. 2, an organic thin-film solar battery 20 has a substrate 11; a mesh electrode 12 which is formed on the substrate 11; a hole transport layer (charge transport film) 13 which is formed so as to cover the mesh electrode 12; a photoelectric conversion layer 14 which is formed on the hole transport layer 13; and an counter electrode 15 which is formed on the photoelectric conversion layer 14.

In the organic thin-film solar battery 20, charges that are generated inside the photoelectric conversion layer 14 due to incident light 21 from the opening of the mesh electrode 12 move in the film thickness direction of the photoelectric conversion layer 14 and extracted to the hole transport layer 13. Subsequently, the charges extracted to the hole transport layer 13 move inside the hole transport layer 13 in the film surface direction. Then, at the contact interface between the hole transport layer 13 and the mesh electrode 12, the charges are extracted to the mesh electrode 12.

In the case where the electrode is at least a mesh electrode 12, the hole transport layer, which is the charge transport film, is formed at the opening of the mesh electrode, and since the photoelectric conversion layer is in contact with the hole transport layer, it is possible to improve charge extraction efficiency by making the transfer of charges from the photoelectric conversion layer to the transparent electrode smooth. Specifically, since the hole transport layer (charge transport film) has a function of transporting holes, it is possible to improve hole extraction efficiency by making the transfer of holes from the photoelectric conversion layer to the mesh electrode smooth.

(a) Transparent Electrode

In the case where the above-described transparent electrode has a form of a meshed shape, the size of the opening of the electrode is appropriately selected depending on the area of the whole mesh electrode, but is preferably within a range of from about 1 $\mu m^2$ to about 2,500 $\mu m^2$, and more preferably within a range of from 1 $\mu m^2$ to 100 $\mu m^2$. When the size of the opening is within the above range, light may be sufficiently transmitted and simultaneously, the mesh electrode may have a sufficient area, so that charge transfer efficiency of the mesh electrode becomes good, and at the same time, the contact area between the mesh electrode and the hole transport layer may also become practically sufficient, so that the charge extraction efficiency becomes good.

(b) Hole Transport Layer

The hole transport layer used in the exemplary embodiment of the present invention is the one to which the above-described charge transport film of the present invention is applied. It is enough that the hole transport layer is formed at least at the opening of the transparent electrode, and the hole transport layer is disposed so as to contact directly with the transparent electrode and the photoelectric conversion layer.

Further, in the exemplary embodiment, the charge transport film has a function of transporting holes, and is a layer to be disposed so that extraction of holes from the photoelectric conversion layer to the mesh electrode is easily carried out. The formation of this hole transport layer enables enhancement in the efficiency of hole extraction from the photoelectric conversion layer to the mesh electrode, and as a result, it becomes possible to improve the photoelectric conversion efficiency.

The arrangement of the hole transport layer is not particularly limited as long as the hole transport layer is formed at least at the mesh-shaped opening in the transparent electrode. The hole transport layer 13 may be formed only at the opening of the mesh electrode 12, or may be formed on the opening of the mesh electrode 12 and the mesh electrode 12.

In the exemplary embodiment, since the incident light transmits from the opening of the mesh electrode to the photoelectric conversion layer, the hole transport layer, which is formed at the opening of the mesh electrode, should have transparency. Specifically, an overall optical transmittance of the hole transport layer is preferably 70% or higher, more preferably 80% or higher, and even more preferably 90% or higher. When the overall optical light transmittance is within the above range, light can be sufficiently transmitted from the mesh electrode side.

Note that, the above overall optical light transmittance denotes a value measured with respect to the visible light region by using an overall light transmittance meter (trade name: COLOUR S&M COMPUTER MODEL SM-C: model number; manufactured by Suga Test Instruments Co., Ltd.).

(c) Photoelectric Conversion Layer

The photoelectric conversion layer used in the exemplary embodiment is formed between the transparent electrode and the counter electrode. Note that, the term "photoelectric conversion layer" refers to a member that contributes for charge separation of the organic thin-film solar battery and has a function for transporting the generated electrons and holes toward the electrode at the opposite direction, respectively.

The photoelectric conversion layer in the exemplary embodiment may be a monolayer having both functions of an electron accepting function and an electron donating function, or may be an integrated layer prepared by laminating an electron accepting layer having an electron accepting function and an electron donating layer having an electron donating function.

(d) Counter Electrode

The counter electrode used in the invention is an electrode that is countered to the transparent electrode and is an electrode (electron extracting electrode) for extracting the electrons generated at the photoelectric conversion layer. In the invention, since the light transmits from the opening of the mesh electrode, the counter electrode may be opaque.

The material for forming the counter electrode is not particularly limited as long as the material has electric conductivity. Since the counter electrode is an electron extracting electrode, it is preferable that the counter electrode has a low work function. Specifically, examples of a material having a low work function may include Li, In, Al, Ca, Mg, Sm, Tb, Yb, Zr, and LiF.

The counter electrode may be a monolayer or may be an integrated layer prepared by using materials having different work functions.

Concerning the thickness of the counter electrode, in the case where the counter electrode is a monolayer, the thickness of the counter electrode is preferably within a range of from 0.1 nm to 500 nm, and more preferably within a range of from 1 nm to 300 nm, and in the case where the counter electrode is composed of plural layers, the total thickness of the layers forming the counter electrode is preferably within a range of from 0.1 nm to 500 nm, and more preferably within a range of from 1 nm to 300 nm. In a case in which the thickness is less than the above range, a sheet resistance of the counter electrode may become too large, and there is possibility that the generated electrons are not sufficiently transmitted to an external circuit. In contrast, in a case in which the thickness is more than the above range, the overall optical transmittance is lowered, and there is possibility of lowering the photoelectric conversion efficiency.

Further, the counter electrode may be formed on the whole surface of the photoelectric conversion layer, or may be formed in a pattern shape.

(e) Substrate

In the organic thin-film solar battery according to the present invention, the mesh electrode 12 and the hole transport layer 13 may be formed on the substrate 11, or the counter electrode 15 may be formed on the substrate 11.

The substrate used in the invention may be either transparent or opaque. However, in a case in which a transparent electrode and an electrically conductive polymer layer are formed on a substrate, since the substrate side becomes a light accepting surface, a transparent substrate is preferable. The transparent substrate is not particularly limited, and examples thereof may include transparent rigid materials that do not have flexibility, such as a quartz glass, PYREX (registered trademark), and a synthetic quartz plate, and transparent flexible materials having flexibility such as a transparent resin film and a resin plate for optical use.

(f) Electron Extracting Layer

In the exemplary embodiment, an electron extracting layer may be formed between the photoelectric conversion layer and the counter electrode. The electron extracting layer is a layer disposed for the purpose of easily carrying out the extraction of electrons from the photoelectric conversion layer to the counter electrode (electron extracting electrode). By providing the electron extracting layer, the efficiency of electron extraction from the photoelectric conversion layer to the electron extracting electrode can be enhanced, whereby improvement in photoelectric conversion efficiency becomes possible.

(g) Other Constituent Member

The organic thin-film solar battery in the exemplary embodiment may have the constituent members described below, as necessary, in addition to the above-described constituent members. For example, the organic thin-film solar battery according to the present invention may have function layers such as a protective sheet, a filling material layer, a barrier layer, a protective hard-coat layer, a hardness supporting layer, a stain-proofing layer, a high light reflection layer, a light enclosing layer, an ultraviolet ray and/or infrared ray blocking layer, or a sealing material layer. Further, according to the layer constitution, an adhesion layer may be formed between the function layers.

The organic thin-film solar battery in the exemplary embodiment of the present invention has a stable hole transport layer prepared by applying the charge transport film of the present invention, and therefore, the organic thin-film solar battery has excellent durability. This application claims priority from JP-A No. 2009-275886 filed on Dec. 3, 2009, and the disclosures of JP-A No. 2009-275886 and JP-A No. 2010-254140 filed on Nov. 12, 2010, are incorporated by reference herein.

EXAMPLES

Hereinafter, the present invention is specifically explained with reference to the examples. The materials, reagents, amounts of substances and ratios thereof, operations, or the like shown in the following examples may be appropriately changed as long as not departing from the spirits of the invention. Accordingly, it should be construed that the scope of the present invention is not limited to the following specific examples.

Example 1

1. Fixation of Hole Transporting Agent (Charge Transporting Agent)

(Preparation of Coating Liquid A for Forming Hole Injection Layer)

1% by mass of compound A which is a tetrafunctional acrylate compound [having the structure shown below: which corresponds to the exemplary compound (H-29) described above], 0.25% by mass of PC-Z type polycarbonate (trade name: PANLIGHT TS-2020, manufactured by Teijin Chemicals Ltd.) and 98.75% by mass of a solvent [a solvent prepared by mixing tetrahydrofuran (hereinafter, described as THF) and xylene at a mass ratio of THF/xylene=70/30] were mixed to prepare a coating liquid A for forming a hole injection layer.

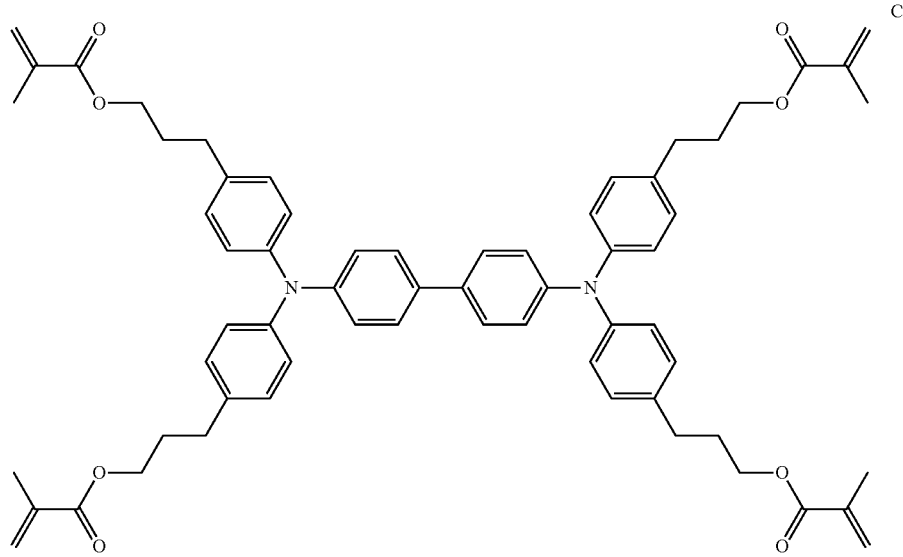

Compound A (Preparation of Organic EL Element)

ITO (indium tin oxide) was deposited at a thickness of 150 nm on a glass substrate having a size of 25 mm×25 mm×0.7 mm, to prepare a transparent supporting substrate. This transparent supporting substrate was subjected to etching and then subjected to washing, thereby obtaining an ITO glass substrate.

Onto the ITO glass substrate thus obtained, the coating liquid A for forming a hole injection layer was spin-coated, and then dried at 150° C. for 10 minutes, thereby forming a hole injection layer precursor (having a film thickness of about 40 nm).

The hole injection layer precursor was irradiated with low-temperature $N_2$ plasma for 10 seconds by using an S-5000 model atmospheric pressure low temperature plasma jet apparatus (discharge gas: nitrogen), manufactured by SAKIGAKE-Semiconductor Co., Ltd.), to form a hole injection layer A (a charge transport film of the present invention).

Subsequently, on the hole injection layer A, a hole transport layer (α-NPD (N,N'-dinaphthyl-N,N'-diphenyl-[1,1'-biphenyl]-4,4'-diamine)) with a film thickness of 10 nm, a light-emitting layer (CBP (4,4'-di(N-carbazole)-biphenyl):Ir complex ($Ir(ppy)_3$ (fac-tris-(2-phenylpyridinate-N,C2') iridium (III)), at a weight ratio of 95:5) with a film thickness of 30 nm, and an electron transport layer (BAlq (aluminium (III) bis(2-methyl-8-quinolinato)-4-phenylphenolate)) with a film thickness of 40 nm were deposited in accordance with a vacuum deposition method.

Then, on the resulting layers, lithium fluoride was deposited to give a thickness of 1 nm, and then metal aluminum was deposited thereon at a thickness of 70 nm to form a cathode.

The lamination body thus prepared was placed in a globe box substituted with argon gas, and it was sealed by the use of a sealing can made of a stainless steal and an ultraviolet-curable adhesive (trade name: XNR5516HV, manufactured by Nagase-Ciba Co., Ltd.). Thus, an organic EL element of Example 1, which was equipped with a hole injection layer composed of the charge transport film of the present invention, was obtained.

Comparative Example 1

Preparation of an organic EL element of Comparative Example 1 was conducted in a manner substantially similar to that in Example 1, except that, after spin-coating with the coating liquid A for forming a hole injection layer in Example 1, the conditions for drying [at 150° C. for 10 minutes] were changed to 150° C. and 30 minutes, and irradiation with low-temperature $N_2$ plasma was not carried out.

Comparative Example 2

Preparation of Coating Liquid B for Forming Hole Injection Layer

To the coating liquid A for forming a hole injection layer, 0.005% by mass of polymerization initiator V-601 (trade name, manufactured by WAKO Pure Chemical Industries, Ltd.) was further added and mixed, to prepared a coating liquid B for forming a hole injection layer.

Preparation of an organic EL element was conducted in a manner substantially similar to that in Comparative Example 1, except that the coating liquid B for forming a hole injection layer obtained as described above was used instead of using the coating liquid A for forming a hole injection layer used in Comparative Example 1.

(Performance Evaluation)

(1) Efficiency

With regard to the organic EL elements obtained in Example 1, and Comparative Examples 1 and 2, the emission brightness under the condition of a driving current density of 5.4 mA/cm$^2$ was measured. As to the method for measurement, spectral radiance of the front face of the organic EL element was measured using a spectral radiance meter (trade name: CS-1000, manufactured by Konica Minolta Holdings, Inc.), and the external quantum efficiency was calculated. The external quantum efficiency being 5% or more is judged to be excellent, and the external quantum efficiency being 3% or more is a level practically non-problematic.

(2) Observation of Light-Emitting Surface

The light-emitting surfaces when voltage of 15 V was applied were observed using a steromicroscope. The results of observation are shown in Table 1.

(Results of Evaluation)

Figure 3A:
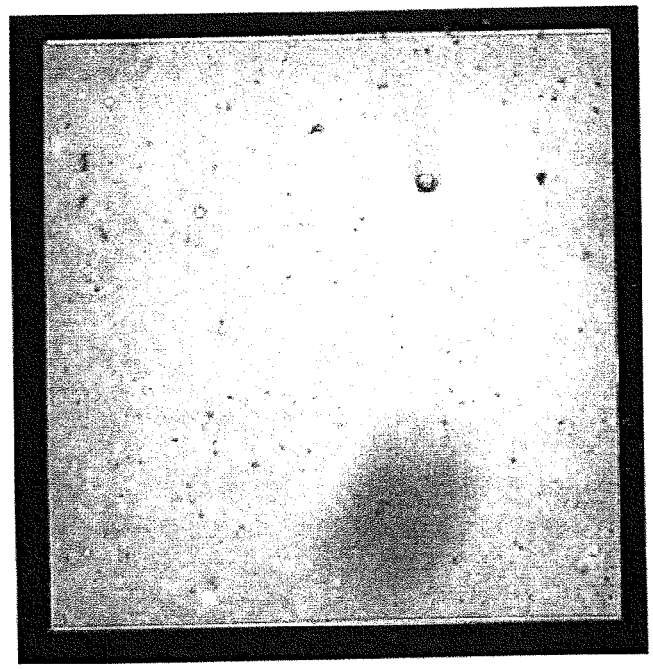
FIG. 3A is a stereophotomicrograph obtained by photographing a light-emitting surface of the light-emitting element of Example 1.
Figure 3B:
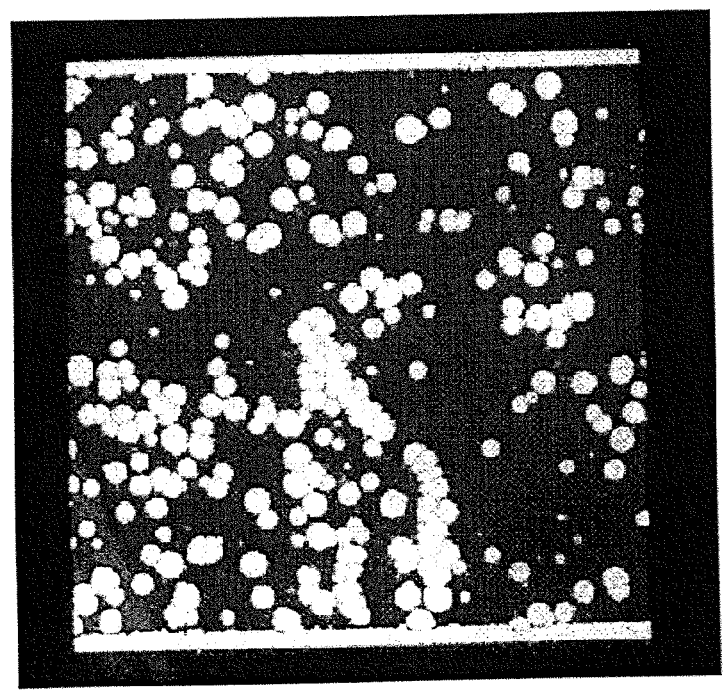
FIG. 3B is a stereophotomicrograph obtained by photographing a light-emitting surface of the light-emitting element of Comparative Example 1.
Figure 3C:
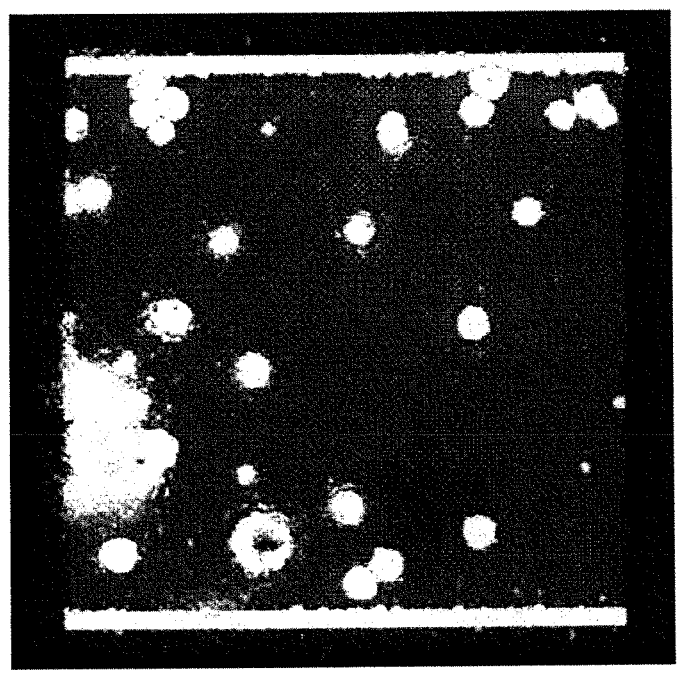
FIG. 3C is a stereophotomicrograph obtained by photographing a light-emitting surface of the light-emitting element of Comparative Example 2.

The obtained results are shown in Table 1. Further, FIG. 3A is a stereophotomicrograph of a light-emitting surface in the organic EL element of Example 1, and FIGS. 3B and 3C are stereophotomicrographs of light-emitting surfaces in the organic EL elements of Comparative Example 1 and Comparative Example 2, respectively.

TABLE 1

| | External Quantum Efficiency (%) | Light-emitting Surface |
|---|---|---|
| Example 1 | 8.4 | Uniform surface light-emitting |
| Comparative Example 1 | 6.5 | Local luminescence spots |
| Comparative Example 2 | 0.86 | Local luminescence spots |

From the results shown in Table 1, it was revealed that the organic EL elements of Example 1 and Comparative Example 1 exhibited a good external quantum efficiency however, the organic EL element of Comparative Example 2 exhibited a low external quantum efficiency. Further, from the results of the observation of the light-emitting surfaces shown in FIGS. 3A to 3C, it was confirmed that a uniform light emission was obtained in the light-emitting surface in the organic EL element of Example 1. From the results of Example 1, it was presumed that the uniform surface light emission was obtained for the following reason. Namely, due to addition of radicals from the N$_2$ plasma in the N$_2$ flow, a polymerization reaction proceeded, and thus the compound A was fixed in the cured film by crosslinking, and as a result, crystallization of the compound A could be suppressed and hole mobility became uniform in the plane, which leads to the uniform surface light emission.

In contrast, in Comparative Example 1, although the organic EL element exhibited a high external quantum efficiency, there were luminescence spots in the light-emitting surface, and a non-uniform light emission was observed. The reason for this is thought as follows. Namely, since polymerization was carried out in the absence of a radical generating agent, the compound A was unevenly distributed, and as a result, a uniform light emission was not obtained. Further, in Comparative Example 2, the organic EL element exhibited a low external quantum efficiency, and luminescence spots were locally occurred in the light-emitting surface. The reason for this is presumed as follows. Namely, in the organic EL element of Comparative Example 2, even in the presence of a radical generating agent, the polymerization reaction of film did not proceed sufficiently due to polymerization inhibition caused by oxygen or the like. Therefore, fixation of the compound A was insufficient, and at the same time, crystallization of the compound A occurred. As a result, transfer of holes was not uniformly carried out in the hole injection layer, which caused the low external quantum efficiency and the occurrence of local luminescence spots.

Synthesis Example 1

Synthesis of Compound 1

4-(benzyloxy)benzoic acid (20.0 g, 87.6 mmol), 4-(hexyloxy)phenol (17.0 g, 87.6 mmol), N,N'-dicyclohexylcarbodiimide (21.7 g, 105 mmol) and 4-dimethylaminopyridine (535 mg, 4.38 mmol) were dissolved in 300 mL of methylene chloride. The resulting solution was stirred for 3 hours at room temperature. Then, 300 mL of pure water was added thereto, and then the resulting liquid was filtered to remove insoluble matters. Thereafter, the obtained solution was subjected to separation operation, and the resulting methylene chloride solution was washed with a saturated aqueous sodium chloride solution and dried over magnesium sulfate. After methylene chloride was distilled off, the resulting solid matter was washed with methanol. Thereby, a white solid compound, 4-(hexyloxy)phenyl 4-(benzyloxy)benzoate (24.9 g) was obtained.

The 4-(hexyloxy)phenyl 4-(benzyloxy)benzoate obtained as described above (5.0 g, 12.4 mmol) and palladium on carbon (2.5 g in the wet state) were placed in a sealed container under a nitrogen atmosphere, and dehydrated THF was slowly added thereto. Then, 28 mL of 1,4-cyclohexadiene was carefully and slowly added thereto dropwise, while heating at 60° C. and stirring. After the addition, the mixture was further stirred for additional 3 hours at 60° C. After the mixture was cooled to room temperature, the mixture was filtered through Celite and the solvents were removed by distillation. Thereby, a white solid compound, 4-(hexyloxy)phenyl 4-hydroxybenzoate (3.8 g) was obtained.

The 4-(hexyloxy)phenyl 4-hydroxybenzoate obtained as described above (3.41 g, 10.8 mmol), potassium carbonate (2.24 g, 16.2 mmol) and 54 mL of N,N-dimethylacetamide were placed in a sealed container, whose contents were replaced by nitrogen. While stirring the above mixture at room temperature, acryloyl chloride (1.18 g, 13.0 mmol) was slowly added thereto dropwise. The resulting mixture was further stirred for additional 1 hour. Then, water and ethyl acetate were added thereto, and separation operation was performed. The ethyl acetate phase was washed with a saturated aqueous sodium chloride solution, dried over magnesium sulfate, and the solvent were removed by distillation. Subsequently, the resulting residue was purified by silica gel column chromatography (hexane/ethyl acetate=10/1) to obtain 3.17 g of compound 1 (having the structure shown below).

Synthesis Example 2

Synthesis of Compound 2

Compound 2 (having the structure shown below) was obtained in a manner substantially similar to that in the above Synthesis Example 1, except that 4-(pentyl)phenol and 4-(tosyloxy)butyl acrylate were used respectively instead of 4-(hexyloxy)phenol and acryloyl chloride used in the Synthesis Example 1.

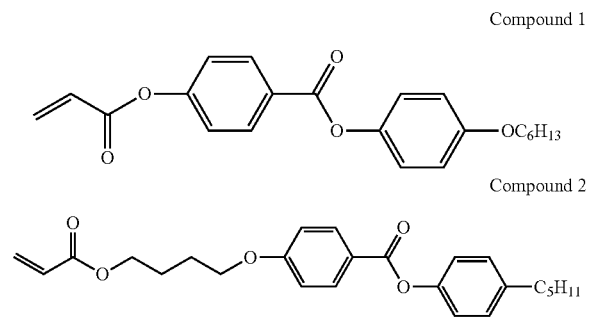

Compound 1

Compound 2

Example 2

Fixation of Liquid Crystal (Film-Formation of Charge Transport Film Containing Compound 1)

A THF solution (solid matter concentration of 5% by mass) of the obtained compound 1 (having the above structure) was spin-coated (1,000 rpm, 25 sec) on a glass substrate (2.5 cm×2.5 cm) to form a coating film.

After drying the coating film in vacuo, the coating film was processed using an atmospheric pressure plasma irradiation apparatus (model number: S5000, manufactured by SAKIGAKE-Semiconductor Co., Ltd.; used gas: nitrogen, irradiation time: 20 sec, substrate temperature: 70° C.), thereby obtaining a cured film (charge transport film). The melting point of this cured film was equal to or higher than 250° C. It was confirmed that polymerization proceeded by applying the plasma treatment step, to form a cured film. Note that, the melting point of the dried coating film before the plasma treatment step was 56° C.

The coating film was observed before plasma treatment at 70° C. and after plasma treatment at room temperature, by the use of a polarization microscope. As a result, there was little difference between the observed images. It is understood that the orientation order of the liquid crystal phase was maintained during the plasma treatment.

Example 3

A cured film (charge transport film) was obtained by performing a low temperature plasma treatment in a manner substantially similar to that in the above Example 2, except that the compound 2 obtained in Synthesis Example 2 was used in place of the compound 1 used in Example 2. The melting point of this cured film was 143° C. It was confirmed that polymerization proceeded by applying the plasma treatment step, to form a cured film. Note that, the melting point of the dried coating film before the plasma treatment step was 56° C.

The coating film was observed before plasma treatment at 70° C. and after plasma treatment at room temperature, by the use of a polarization microscope. As a result, there was little difference between the observed images. It is understood that the orientation order of the liquid crystal phase was maintained during the plasma treatment.

Comparative Example 3

A THF solution (solid matter concentration of 5% by mass) containing 98 parts by weight of the obtained compound 1 (having the above structure) and IRGACURE 907 (trade name, manufactured by Ciba Specialty Chemicals; 2 parts by weight) as a radical polymerization initiator was spin-coated (1,000 rpm, 25 sec) on a glass substrate (2.5 cm×2.5 cm) to form a coating film.

After drying the coating film in vacuo, the coating film was irradiated with UV light under nitrogen atmosphere (xenon light source, quantity of light: 11.0 mW/cm$^2$, irradiation time: 20 sec, substrate temperature: 70° C.), thereby obtaining a cured film (charge transport film). The melting point of this cured film was about 200° C. It was confirmed that polymerization proceeded by applying the UV light irradiation in the presence of a polymerization initiator, to form a cured film. Note that, the melting point of the dried coating film before the UV light irradiation was 56° C.

Comparative Example 4

A cured film (charge transport film) was obtained, through performing the UV light irradiation, in a manner substantially similar to that in the above Comparative Example 3, except that the compound 2 obtained in Synthesis Example 2 was used in place of the compound 1 used in Comparative Example 3. The melting point of this cured film was 122° C. It was confirmed that polymerization proceeded by applying the UV light irradiation in the presence of a polymerization initiator, to form a cured film. Note that, the melting point of the dried coating film before the UV light irradiation was 56° C.

From the results of Examples 2 and 3 and Comparative Examples 3 and 4, it was revealed that, by applying an atmospheric pressure low temperature plasma treatment step according to the present invention, liquid crystal molecules could be fixed in the cured film, in the absence of a polymerization initiator and also without causing thermal transition in liquid crystal phase. Here, it is understood that, by applying the plasma treatment step according to the present invention, a film having a higher crosslinking density and a higher melting point than those of the cured film obtained by photopolymerization in the presence of a polymerization initiator was formed.

Example 4

Formation of Charge Transporting Film (Preparation of Quartz Glass Substrate Equipped with Oriented Film)

A horizontally oriented film SE-130 (trade name, manufactured by Nissan Chemical Industries, Ltd.) was spin-coated onto a quarts glass which had been subjected to UV-ozone treatment (available from IGC), and was heated and dried at 100° C. for 10 minutes, and then further heated and dried at 200° C. for 1 hour. The quarts glass substrate equipped with an oriented film thus obtained was subjected to a rubbing treatment by the use of a rubbing machine (manufactured by EHC Co., Ltd.).

(Preparation of Liquid Crystal Film Containing Cross-linkable Compounds)

600 μL of THF was added to a mixture of trans-4-(5-propyl-1,3-dioxan-2-yl)benzonitrile (9.0 mg), trans-4-(5-butyl-1,3-dioxan-2-yl)benzonitrile (9.0 mg), trans-4-(5-pentyl-1,3-dioxan-2-yl)benzonitrile (9.0 mg), and bis-EDOT (ethylenedioxythiophene: having the structure shown below) (3.0 mg) to dissolve this mixture. The resulting solution was spin-coated (500 rpm for 5 seconds, and thereafter 1,000 rpm for 20 seconds) onto the above quarts glass substrate that had been subjected to the rubbing treatment, and dried under reduced pressure at room temperature under light shielding conditions.

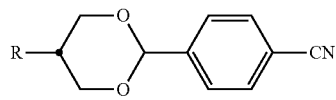

R = $C_3H_7$, $C_4H_9$, $C_5H_{11}$

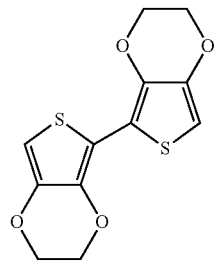

Bis-EDOT (Confirmation with Respect to Orientation)

The obtained liquid crystal film containing crosslinkable compounds was observed by polarization microscope observation (under cross-nicol way) and, as a result, it was confirmed that the liquid crystals had a uniaxial orientation.

This film was then processed using an atmospheric pressure plasma irradiation apparatus (model number: 55000, manufactured by SAKIGAKE-Semiconductor Co., Ltd.; used gas: nitrogen, irradiation time: 20 sec) in atmospheric air, and thereafter, a part of the film was analyzed using a mass spectrometer (MALDI (matrix-assisted laser desorption ionization)). As a result, many peaks were observed in the region of molecular weights higher than those of the benzonitrile derivatives having the above structure and bis-EDOT used. From the results, it is understood that bis-EDOT, which is a charge transporting agent precursor, was polymerized in the liquid crystal phase having a uniaxial orientation and converted to PEDOT having charge transportability.

Example 5

Preparation of Organic Electroluminescence Element

ITO (indium tin oxide) was deposited, as an anode, at a thickness of 150 nm by sputtering on a glass substrate having a size of 0.7 mm in thickness and 25 mm square, and thereafter the ITO layer was subjected to etching and cleaning. The resulting substrate having a layer of ITO was placed in a cleaning vessel, and subjected to ultrasonic cleaning in 2-propanol, and then subjected to a UV-ozone treatment for 30 minutes. On the glass substrate thus obtained, the following layers were formed.

Note that, the spin coat and drying were performed in a glove box (a dew point of −60° C., and an oxygen concentration of 1 ppm).

Next, a coating liquid for forming a hole injection layer prepared by dissolving or dispersing 5 parts by mass of the compound A (structural formula described below; Compound 1 described in US Patent No. US2008/0220265) in 995 parts by mass of electronic industrial cyclohexanone (manufactured by Kanto Chemical Co., Inc.) was spin-coated on the anode (ITO), and then dried at 200° C. for 30 minutes, thereby forming a hole injection layer having a thickness of 5 nm.

Compound A

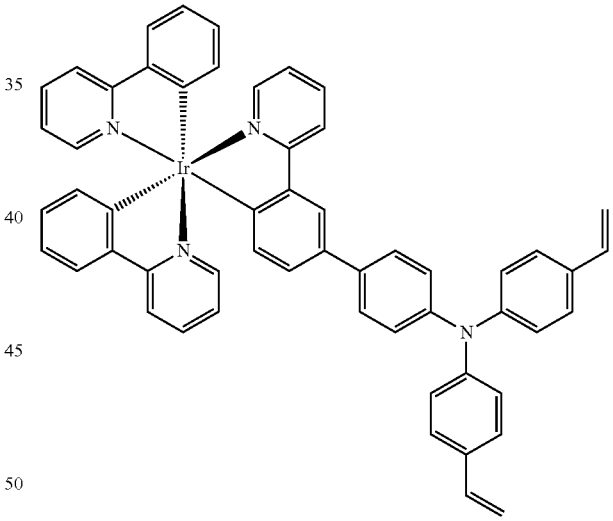

Then, 10 parts by mass of the compound B (structural formula described below; HTL-1 described in US Patent No. US2008/0220265) was dissolved in 990 parts by mass of toluene (dehydrated) (manufactured by WAKO Pure Chemical Industries, Ltd.) to prepare a coating liquid for forming a hole transport layer. This coating liquid for forming a hole transport layer was spin-coated on the hole injection layer, and then dried at 200° C. for 30 minutes, thereby forming a hole transport layer having a thickness of 18 nm.

The hole transport layer thus formed was irradiated with low-temperature $N_2$ plasma for 10 seconds by using an S5000 MODEL (trade name); atmospheric pressure low temperature plasma jet apparatus (discharge gas: nitrogen), manufactured by SAKIGAKE-Semiconductor Co., Ltd.

Compound B

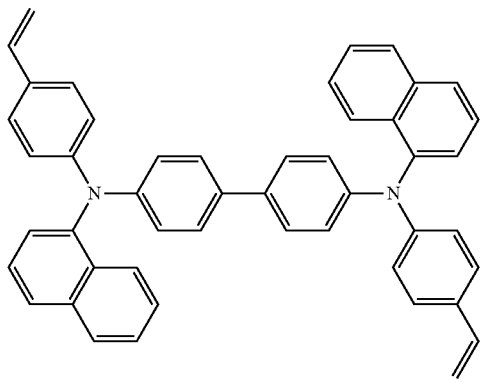

6.6 parts by mass of the compound C (the host compound of structural formula described below; Host-1 described in US Patent No. US2008/0220265) and 0.9 parts by mass of the light emitting dopant of the compound D (structural formula described below; Green-1 described in US Patent No. US2008/0220265) were dissolved or dispersed in 992.5 parts by mass of electronic industrial 2-butanone (manufactured by Kanto Chemical Co., Inc.), then molecular sieve (trade name: MOLECULAR SIEVE 3A 1/16, manufactured by WAKO Pure Chemical Industries, Ltd.) was added thereto, and then the resulting liquid was filtered using a syringe filter with a pore size of 0.22 μm in the glove box, to prepare a coating liquid for forming a light-emitting layer. Subsequently, this coating liquid for forming a light-emitting layer was spin-coated in the glove box, and then dried at 120° C. for 30 minutes, thereby forming a light-emitting layer having a thickness of 30 nm.

Compound C

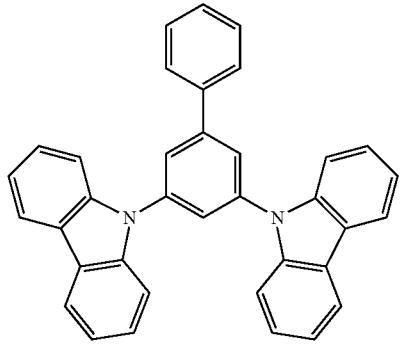

Compound D

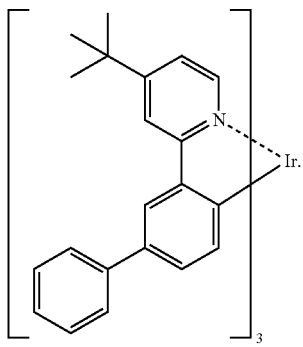

Then, on the light-emitting layer, BAlq (bis(2-methyl-8-quinolinolato)(4-phenylphenolato) aluminum (III)) was deposited in accordance with a vacuum deposition method, thereby forming electron transport layer having a thickness of 40 nm.

Subsequently, lithium fluoride (LiF) was deposited on the electron transport layer, to form an electron injection layer having a thickness of 0.7 nm.

Thereafter, metal aluminum was deposited on the electron injection layer, to form a cathode having a thickness of 100 nm.

The lamination body thus prepared was placed in a glove box substituted with argon gas, and it was sealed by the use of a sealing can made of stainless steal and an ultraviolet-curable adhesive (trade name: XNR5516HV, manufactured by Nagase-Ciba Co., Ltd.). Thus, an organic EL element was prepared.

Comparative Example 5

Preparation of an organic EL element was conducted in a manner substantially similar to that in Example 5, except that the hole transport layer was not irradiated with plasma.

(Performance Evaluation)

(1) Efficiency

With regard to the organic EL elements obtained in Example 5 and Comparative Example 5, the emission brightness under the condition of a driving current density of 5.4 mA/cm$^2$ was measured. As to the method for measurement, spectral radiance of the front face of the organic EL element was measured using a spectral radiance meter (trade name: CS-1000, manufactured by Konica Minolta Holdings, Inc.), and the external quantum efficiency was calculated. Results are shown in the following Table 2.

TABLE 2

| | External Quantum Efficiency (%) |
|---|---|
| Example 5 | 5.81 |
| Comparative Example 5 | 3.9 |

From the results shown in Table 2, it was revealed that the organic EL elements of Example 5 exhibited a good external quantum efficiency. Thus, it was confirmed that the organic EL element including the charge transport film of the present invention in which the plasma treatment step has been applied to the hole transport layer, exhibited a good external quantum efficiency as compared to the organic EL element of Comparative Example not applied the plasma treatment.

Example 6

1 mL of ethanol was added to 10 mg of rhodamine B sulfonic acid (Aldrich Prod. No. 34178; Chemical Abstracts Registry Number: 2609-88-3), and was stirred. Thereafter, the mixture was left to stand still. 20 μL of the supernatant was spotted on a glass plate and was dried with air, to form a red-purple dye solid state layer.

On this layer, one droplet of a solution prepared by adding 1 mL of ethyl acetate to 0.2 mL of bisphenol A ethoxylate diacrylate (Aldrich Prod. No. 412090; Chemical Abstracts Registry Number: 64401-02-1) was dropped so as to cover the dye solid state layer. Then, the resulting lamination body was left for 2 hours at room temperature under atmospheric pressure to allow the ethyl acetate to volatile. By this operation, a coating film having a layered structure in which a transparent resin layer was formed on the surface of the dye solid state layer containing rhodamine B sulfonic acid as the dye was formed.

The obtained coating film having a layered structure was subjected to plasma processing as follows. An 55000 MODEL (trade name) atmospheric pressure plasma apparatus, manufactured by SAKIGAKE-Semiconductor Co., Ltd. was used. The sample was disposed so that the distance from the plasma torch tip to the sample was 2 mm, and was irradiated with nitrogen plasma for 30 seconds four times respectively, at room temperature in the atmosphere. Thereby, a cured film having a layered structure in which a transparent resin layer was formed on the surface of the dye solid state layer was obtained.

(Evaluation of Cured Film)

In the cured film having a layered structure thus obtained, a transparent film was formed at the surface. Even when the transparent film surface was touched with a spatula, the bisphenol A ethoxylate diacrylate did not adhere to the spatula. It was confirmed that a cured film was formed.

Next, the cured film having a layered structure was washed with ethyl acetate, and then was further washed with water. However, the red-purple rhodamine B sulfonic acid did not elute from the dye solid state layer. It was revealed that the dye was fixed to the cured film that constituted the dye solid state layer.

In the above evaluation, after washing with ethyl acetate, the cured film was washed with ethanol, instead of using water. As a result, the red-purple rhodamine B sulfonic acid did not elute from the dye solid state layer. It was revealed that the dye incorporated in the cured film that constituted the dye solid state layer did not elute even in the case of using ethanol.

Example 7

A cured film having a layered structure was formed in a manner substantially similar to that in Example 6 described above, except that the plasma irradiation was carried out in a glove box filled with nitrogen gas, instead of carrying out the plasma irradiation under atmospheric pressure in Example 6.

Evaluation was performed in a manner substantially similar to that in Example 6. As a result, the existence of a transparent cured film was confirmed and further, the red-purple rhodamine B sulfonic acid in the dye layer did not elute by using water, as well as by using ethanol.

Comparative Example 6

A film having a layered structure including a dye solid state layer and a transparent resin layer was formed in a manner substantially similar to that in Example 6, except that the irradiation with nitrogen gas plasma was not carried out, after the coating film having a layered structure in which the transparent resin layer was formed on the surface of the dye solid state layer was formed.

Evaluation was performed in a manner substantially similar to that in Example 6. The film surface was touched with a spatula. As a result, the bisphenol A ethoxylate diacrylate adhered to the spatula. It was revealed that the transparent resin layer was not sufficiently cured.

Further, the film having a layered structure was washed with ethyl acetate, and then was further washed with water. As a result, the red-purple rhodamine B sulfonic acid eluted from the dye solid state layer, and the glass plate surface lost their coloring. Furthermore, after washing with ethyl acetate, the film was washed with ethanol, instead of using water. As a result, the red-purple rhodamine B sulfonic acid eluted from the dye solid state layer, and the glass plate surface lost their coloring.

From the results in Examples 6 and 7, and Comparative Example 6, it is understood that, by the irradiation with atmospheric pressure low temperature plasma, a cured film having solvent unpermeability can be easily formed, and that the cured film can prevent dissolution of components of a layer, which is located at the lower layer covered with the cured film, in solvents.

Example 8

13 mg of 13,6-N-sulfinylacetoamidopentacene (Aldrich Prod. No. 666025; Chemical Abstracts Registry Number: 454675-76-4), which is a precursor of a soluble pentacene, an organic semiconductor compound, was dissolved in 1 mL of tetrahydrofuran. Thereafter, the resulting solution was spotted on a filter paper having a size of 25 mm×100 mm at the position about 10 mm from an end of the filter paper and was dried, to form a faint brown colored area.

Then, the colored area was subjected to plasma processing as follows. An S5000 model atmospheric pressure plasma apparatus, manufactured by SAKIGAKE-Semiconductor Co., Ltd. was used. The colored area was disposed so that the distance from the plasma torch tip to the colored area was 5 mm, and was irradiated with nitrogen plasma for 30 seconds at a temperature of around the ordinary temperature (25° C.), in the atmosphere. As a result, the color of the colored area was changed into violet or blue.

One end of the filter paper which was closer to the spotted portion was dipped in tetrahydrofuran, and the filter paper that served as the paper chromatogram was developed. A colored matter of dark blue that was substantially the same color as that of pentacene remained undeveloped at the starting point portion.

Conventionally, the method for converting the pentacene precursor into pentacene has been known. However, from the results in Example 8, it is shown that pentacene which is known as an organic semiconductor compound can be obtained from the pentacene precursor by means of plasma irradiation even in a temperature region of around the ordinary temperature.

The charge transport film of the present invention may be suitably employed in organic electronics elements such as organic electroluminescence elements, organic thin-film solar batteries, and the like.

The foregoing description of the exemplary embodiments of the present invention has been provided for the purposes of illustration and description. It is not intended to be exhaustive or to limit the invention to the precise forms disclosed. The embodiments were chosen and described in order to best explain the principles of the invention and its practical applications, thereby enabling others skilled in the art to understand the invention for various embodiments and with the various modifications as are suited to the particular use contemplated.

All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

The invention claimed is:

1. A charge transport film formed through subjecting a coating film comprising at least one charge transporting agent to an atmospheric pressure plasma treatment, wherein electron transfer between the charge transport film and a substance that contacts with the charge transport film is promoted, wherein the charge transporting agent is a compound having a polymerizable group, and comprises a compound represented by the following Formula (III):

$$R^1R^2C=C(R^3)-(C=O)-O-L-Ar^1-(C=O)-O-Ar^2-R^4 \quad \text{Formula (III)}$$

wherein, in Formula (III), $Ar^1$ and $Ar^2$ each independently represents an arylene group; L represents a divalent linking group selected from the group consisting of alkylene groups having from 1 to 22 carbon atoms, arylene groups having from 6 to 22 carbon atoms, and —O—, or a divalent linking group obtained by combining two or more linking groups selected from the group consisting of alkylene groups having from 1 to 22 carbon atoms, arylene groups having from 6 to 22 carbon atoms, and —O—; and $R^1$, $R^2$, $R^3$ and $R^4$ each independently represents a hydrogen atom or an alkyl group having 1 to 8 carbon atoms.

2. The charge transport film according to claim 1, wherein the coating film further comprises a compound having a crosslinkable group or a polymerizable group.

3. The charge transport film according to claim 2, wherein the compound having a crosslinkable group or a polymerizable group is at least one selected from the group consisting of a polymer having a crosslinkable group, an oligomer having a crosslinkable group and a monomer having a crosslinkable group.

4. The charge transport film according to claim 1, wherein the charge transporting agent incorporated in the coating film is a charge transporting agent precursor that becomes a charge transporting agent by plasma treatment.

5. The charge transport film according to claim 1, further comprising a compound exhibiting liquid crystallinity.

6. The charge transport film according to claim 1, wherein the charge transporting agent comprises a compound exhibiting liquid crystallinity.

7. The charge transport film according to claim 1, wherein the coating film further comprises a compound represented by following Formula (I):

$$A\text{-}G, \quad \text{Formula (I):}$$

wherein, in Formula (I), A represents a residue of a compound that can exist in a liquid crystalline state; and G represents a polymerizable group selected from the group consisting of radically polymerizable groups and cationically polymerizable groups, or a crosslinkable group.

8. The charge transport film according to claim 1, wherein the coating film comprises a compound represented by following Formula (II):

$$T\text{-}G, \quad \text{Formula (II):}$$

wherein, in Formula (II), T represent a residue of a triphenylamine compound; and G represents a polymerizable group selected from the group consisting of radically polymerizable groups and cationically polymerizable groups, or a crosslinkable group.

9. A light emitting element comprising the charge transport film according to claim 1.

10. A photoelectric conversion element comprising the charge transport film according to claim 1.

* * * * *